(12) United States Patent
Park et al.

(10) Patent No.: US 7,550,383 B2
(45) Date of Patent: Jun. 23, 2009

(54) METHODS OF PERFORMING A PHOTOLITHOGRAPHY PROCESS FOR FORMING ASYMMETRIC PATTERNS AND METHODS OF FORMING A SEMICONDUCTOR DEVICE USING THE SAME

(75) Inventors: Joon-Soo Park, Gyeonggi-do (KR); Gi-Sung Yeo, Seoul (KR); Han-Ku Cho, Gyeonggi-do (KR); Sang-Gyun Woo, Gyeonggi-do (KR); Tae-Young Kim, Seoul (KR); Byeong-Soo Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 468 days.

(21) Appl. No.: 11/230,957

(22) Filed: Sep. 20, 2005

(65) Prior Publication Data
US 2006/0099538 A1 May 11, 2006

(30) Foreign Application Priority Data
Nov. 5, 2004 (KR) .................. 10-2004-0090026

(51) Int. Cl.
*H01L 21/44* (2006.01)
*H01L 21/00* (2006.01)

(52) U.S. Cl. ............... 438/671; 438/669; 438/736; 430/312

(58) Field of Classification Search .......... 438/286, 438/669, 671, 637, 736; 430/312
See application file for complete search history.

(56) References Cited

U.S. PATENT DOCUMENTS

| | | | | |
|---|---|---|---|---|
| 6,048,647 A | * | 4/2000 | Miyazaki et al. | 430/5 |
| 6,329,306 B1 | | 12/2001 | Nakao | |
| 2002/0012851 A1 | * | 1/2002 | Coronel et al. | 430/5 |
| 2004/0063000 A1 | * | 4/2004 | Maurer et al. | 430/5 |

FOREIGN PATENT DOCUMENTS

| | | |
|---|---|---|
| KR | 2001-047253 | 6/2001 |
| KR | 2002-053475 | 7/2002 |
| KR | 2004-046702 | 6/2004 |

* cited by examiner

*Primary Examiner*—Michael Trinh
(74) *Attorney, Agent, or Firm*—Myers Bigel Sibley & Sajovec, P.A.

(57) ABSTRACT

There are provided methods of performing a photolithography process for forming asymmetric semiconductor patterns and methods of forming a semiconductor device using the same. These methods provide a way of forming asymmetric semiconductor patterns on a photoresist layer through two exposure processes. To this end, a semiconductor substrate is prepared. A planarized insulating interlayer and a photoresist layer are sequentially formed on the overall surface of the semiconductor substrate. A first semiconductor pattern of a photolithography mask is transferred to the photoresist layer, thereby forming a photoresist pattern on the photoresist layer. A second semiconductor pattern of a second photolithography mask is continuously transferred to the photoresist layer, thereby forming a second photoresist pattern on the photoresist layer. An etching process is performed on the planarized insulating interlayer to expose the semiconductor substrate, using the first photoresist pattern and the second photoresist pattern as etch masks.

28 Claims, 19 Drawing Sheets

US 7,550,383 B2

METHODS OF PERFORMING A PHOTOLITHOGRAPHY PROCESS FOR FORMING ASYMMETRIC PATTERNS AND METHODS OF FORMING A SEMICONDUCTOR DEVICE USING THE SAME

CROSS-REFERENCE TO RELATED APPLICATION

This patent application claims priority from Korean Patent Application No. 10-2004-0090026, filed Nov. 5, 2004, the contents of which are hereby incorporated by reference in their entirety.

BACKGROUND OF INVENTION

1. Technical Field

The invention relates to methods of performing a photolithography process and methods of forming a semiconductor device using the same, and more particularly, to methods of performing a photolithography process for forming asymmetric semiconductor patterns and methods of forming a semiconductor device using the same.

2. Discussion of the Related Art

Recently, the semiconductor market has demanded development of a semiconductor device with a more competitive price as well as a high speed of data input/output and a high capacitance of information storage compared to existing semiconductor devices. In order to achieve these demands, semiconductor devices are presently being formed through reduction of the critical dimension (CD) of the design rule in order to form fine patterns of smaller size and spaces between patterns having a smaller width, while employing existing materials to maintain price competitiveness.

However, if the semiconductor device is formed with a design rule of smaller CD without further change of its structure under the condition as described above, the characteristics of the semiconductor device may deteriorate as a result. The deterioration of the characteristics of the semiconductor device may result through electrical or physical shorts between discrete elements due to the reduction of the design rule. Further, the short of the discrete elements deteriorates interconnection capability of the semiconductor device. This interferes with the fabrication of the semiconductor device while maintaining price competitiveness.

Technologies for solving the above-described problem are discussed in, for example, U.S. Pat. No. 6,329,306 (hereinafter, the '306 patent) to Shusi Nakao et al.

According to the '306 patent, the method includes forming first layers and second layers adjacent to the first layers, using two or more masks and photolithography processes twice. The first and second layers may be holes and lines respectively, or lines and holes respectively. The lines are formed to fill the holes and concurrently, to extend from the holes.

The fine patterning further includes performing etching processes corresponding to the photolithography process. However, the photolithography processes of the '306 patent have different photoresist layers with different (e.g., hole and line) patterns. For this reason, the fine patterning disclosed in the '306 patent necessarily may complicate the semiconductor formation process to form holes and lines. As such, this may lead to an increase in the production cost for the process.

SUMMARY OF THE INVENTION

According to some aspects of the invention, methods are provided for performing a photolithography process for forming asymmetric semiconductor patterns with a design rule of smaller CD with two photolithography masks.

According to other aspects of the invention, methods are provided for forming a semiconductor device using methods of performing a photolithography process for forming asymmetric semiconductor patterns with a design rule of smaller CD and to simplify a semiconductor formation process with two photolithography masks.

According to further aspects of the invention, methods are provided for forming asymmetric semiconductor patterns that include forming a photoresist layer on a semiconductor substrate. A first photolithography mask is transferred to the photoresist layer. The first photolithography mask comprises a first semiconductor pattern, wherein said elements comprising said pattern is disposed at cross points of horizontal lines and vertical lines on the first photolithography mask. A second photolithography mask is transferred to the photoresist layer. The second photolithography mask comprises a second semiconductor pattern, wherein elements comprising said pattern is disposed on every other (alternate) horizontal line as defined on the first photolithography mask. An element of said second semiconductor pattern is disposed for every two elements of the first semiconductor pattern on alternate horizontal lines of the first photolithography mask and disposed between adjacent elements of the first semiconductor pattern. The first photolithography mask and the second photolithography mask transfer a composite aerial image of the first semiconductor pattern and the second semiconductor pattern that define the asymmetric semiconductor pattern of the invention to the photoresist layer in two dimensions while performing the photolithography process.

According to still further aspects of the invention, methods are provided of forming a semiconductor device using methods of performing a photolithography process for forming asymmetric semiconductor patterns that include preparing a semiconductor substrate having an isolation layer disposed therein. The isolation layer is formed to isolate a plurality of active regions. A planarized insulating interlayer and a photoresist layer are sequentially formed a on an overall surface of the semiconductor substrate. A first semiconductor pattern of a first photolithography mask is transferred to the photoresist layer. The first photolithography mask forms a first photoresist pattern on a first predetermined region of the planarized insulating interlayer respectively. A second semiconductor pattern of a second photolithography mask is transferred to the photoresist layer. The second photolithography mask forms second photoresist pattern on second predetermined region of the planarized insulating interlayer respectively. An etching process is performed on the planarized insulating interlayer to expose the semiconductor substrate, using the first photoresist pattern and the second photoresist pattern as an etch mask. The first photolithography mask is formed to comprise the first semiconductor pattern at cross points of horizontal lines and vertical lines thereof. The second photolithography mask is formed to comprise the second semiconductor pattern, wherein the second semiconductor pattern is disposed on every other horizontal line as defined on the first photolithography mask. The second semiconductor pattern is disposed every two semiconductor patterns on every other horizontal line of the first photolithography mask and to be disposed between adjacent semiconductor patterns.

BRIEF DESCRIPTION OF THE DRAWINGS

Exemplary embodiments of the invention will be readily apparent to those of ordinary skill in the art upon review of the FIG. 1 depicts a flow chart illustrating a method of forming a semiconductor device according to the invention.

DETAILED DESCRIPTION OF EMBODIMENTS ACCORDING TO THE INVENTION

Figure 1:
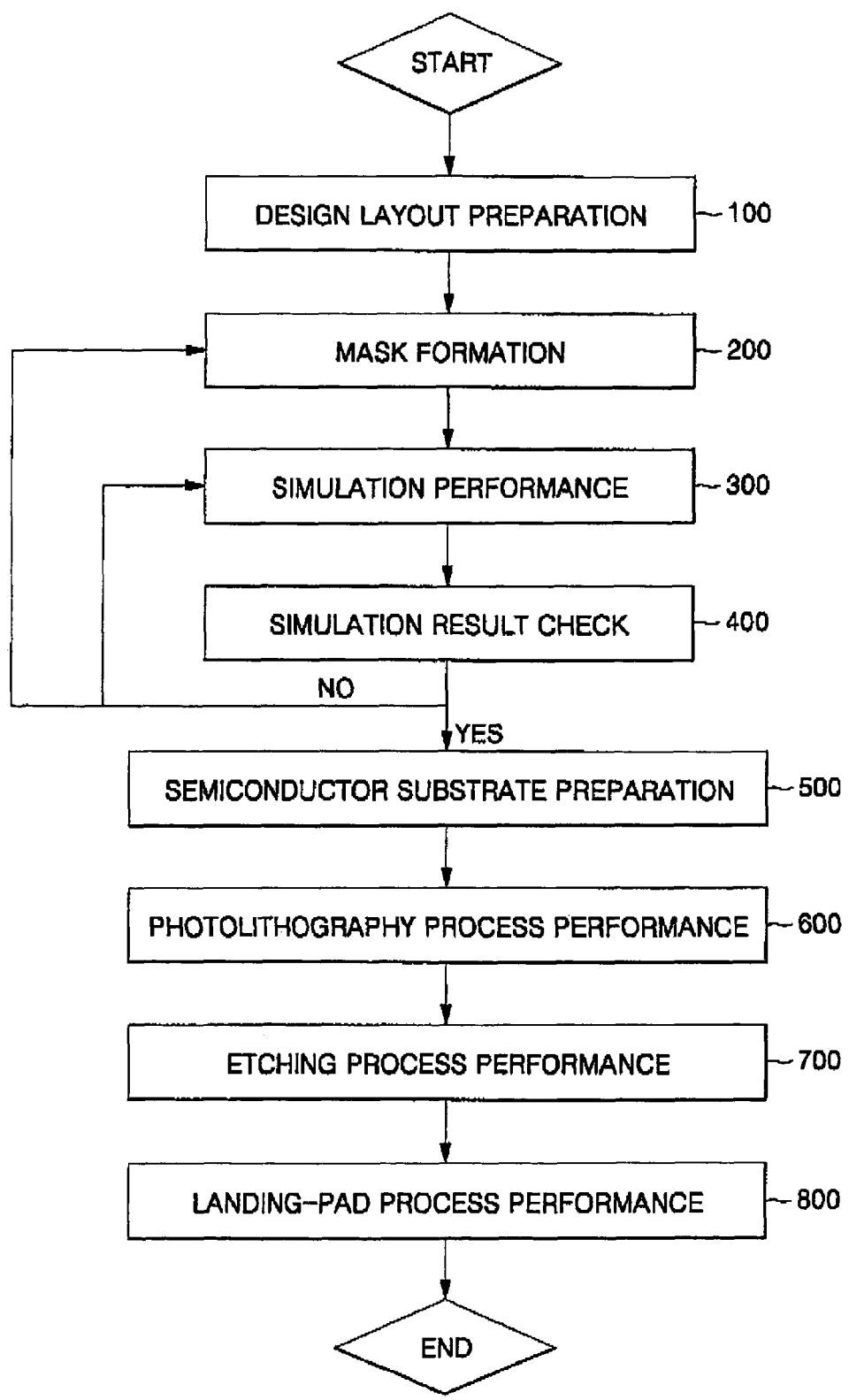

The present invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like reference numerals refer to like elements throughout. Embodiments of the invention are described herein with reference to the drawings that are schematic illustrations of idealized embodiments (and intermediate structures) of the invention. The size, thickness, lengths, and/or widths of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Moreover, vertically aligned layers may be undercut and/or overcut relative to one another due to variations in etch selectivity when etching multiple self-aligned layers using a single photolithographic or other mask. Thus, the regions illustrated in the figures are schematic in nature and their shapes are not intended to illustrate the actual shape of a region of a device and are not intended to limit the scope of the invention.

Unless otherwise defined, all technical and scientific terms used herein have the same meaning as commonly understood by one of ordinary skill in the art to which the invention belongs. All publications, patent applications, patents and other references mentioned herein are incorporated herein by reference in their entirety for their teachings.

The terminology used herein is for the purpose of describing particular embodiments only and is not intended to be limiting of the invention. As used herein, the singular forms "a," "an" and "the" are intended to include the plural forms as well, unless the content clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that although the terms "first," "second" and "third," etc. may be used herein to describe various patterns, regions, layers, and/or sections, these patterns, regions, layers, and/or sections should not be limited by these terms. These terms are only used to distinguish one region, layer, or section from another region, layer, or section. Thus, a first region, layer, or section discussed below could be termed a second region, layer, or section, and similarly, a third without departing from the teachings of the present invention. Thus, the terms "first," "second" and "third," etc. are not intended to convey a sequence or other hierarchy to the associated elements but are used for identification purposes only. The sequence of operations (or steps) is not limited to the order presented in the claims or figures unless specifically indicated otherwise.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under." The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

Figure 2:
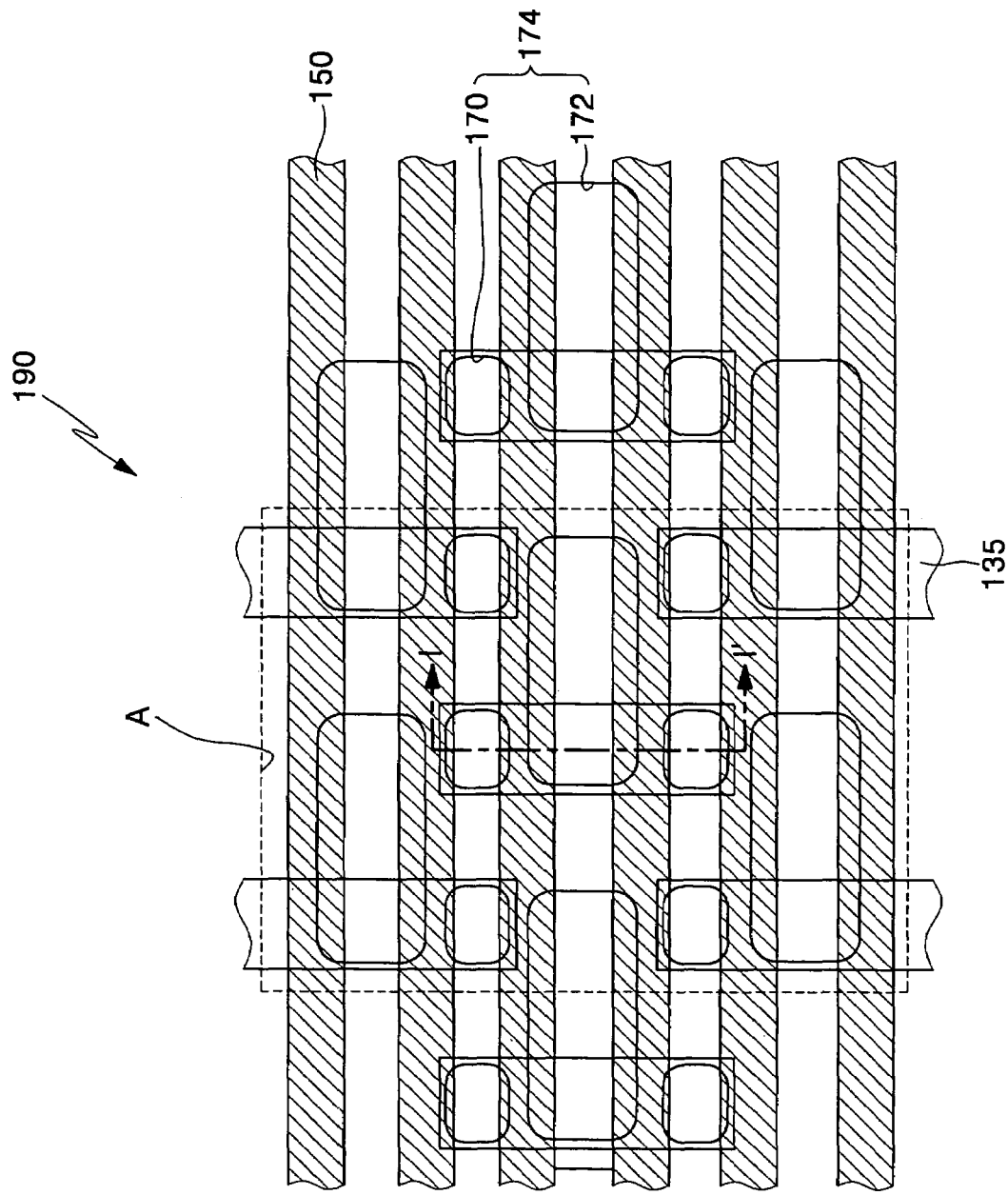
FIG. 2 depicts a schematic layout of a semiconductor device according to the invention.
Figure 3:
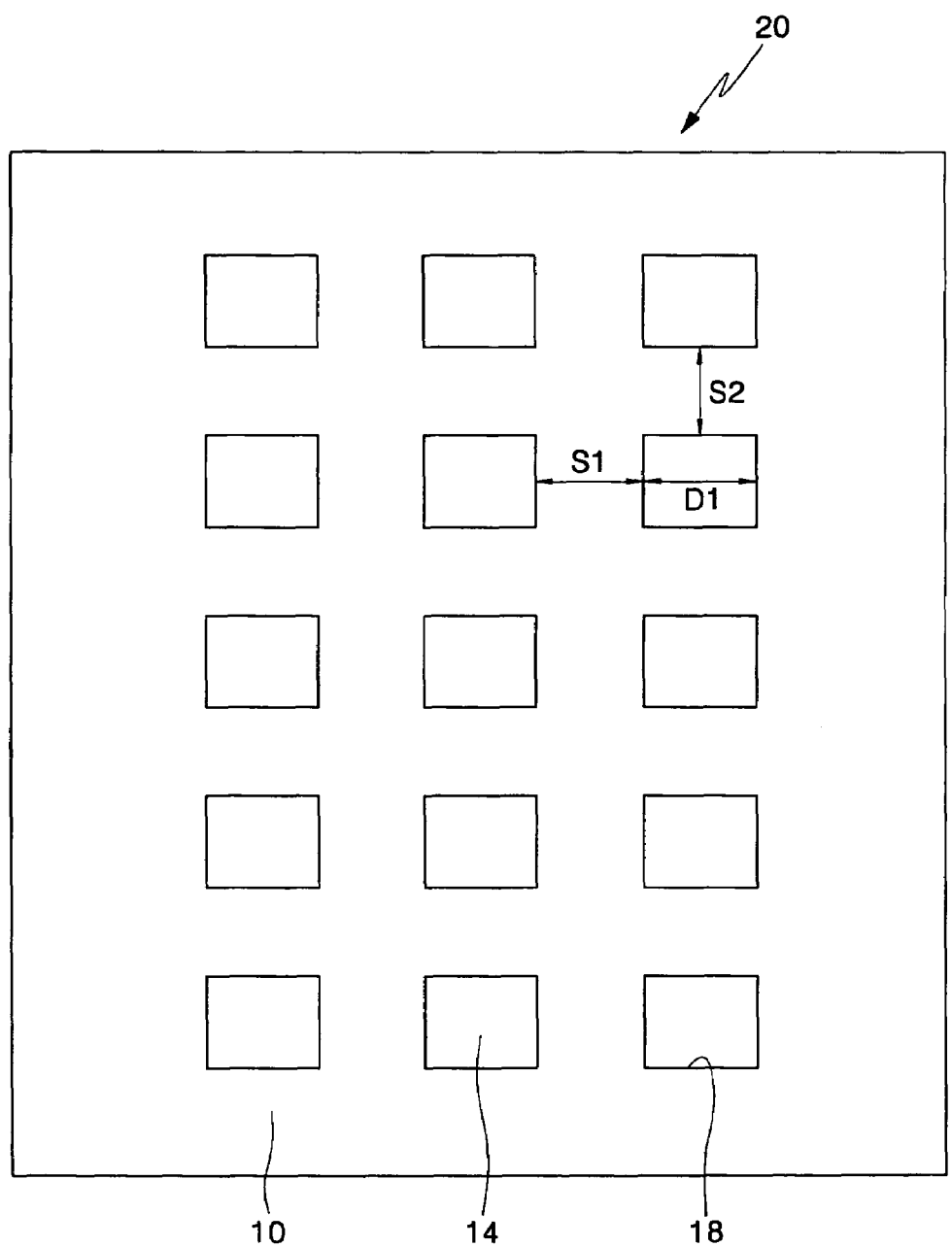
FIG. 3 depicts a first photolithography mask illustrating a semiconductor pattern in a region A of FIG. 2.
Figure 4:
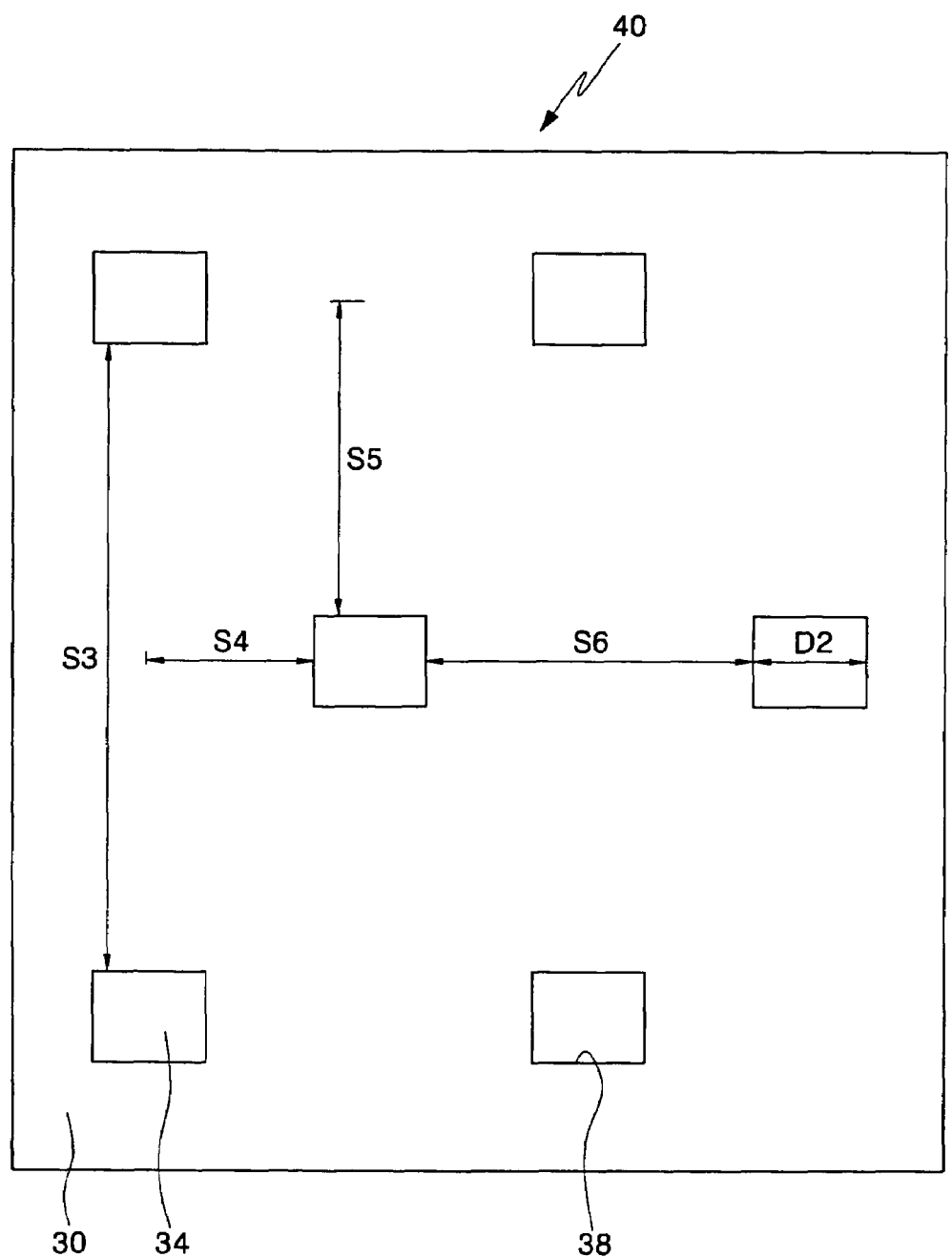
FIG. 4 depicts a second photolithography mask illustrating a second semiconductor pattern in a region A of FIG. 2.

FIG. 1 depicts a flow chart illustrating a method of forming a semiconductor device according to the invention comprising steps 100-800, and FIG. 2 depicts a schematic layout of a semiconductor device 190 according to the invention. Further, FIG. 3 depicts a first photolithography mask illustrating a first semiconductor pattern in region A of FIG. 2, and FIG. 4 depicts a second photolithography mask illustrating a second semiconductor pattern in a region A of FIG. 2.

Referring to FIG. 1, after step 100 (design layout preparation) in the formation of a semiconductor device is completed, several steps 200, 300 and 400 may be considered before the semiconductor formation process (steps 500, 600, 700 and 800) is carried out. Steps 200, 300 and 400 relate to mask formation, simulation performance and simulation result check respectively. Steps 200, 300 and 400 check for missing points in the design layout for a semiconductor device 190 such as is depicted in FIG. 2. The design layout for the semiconductor device is preferably made to have a process constant k1 of about 0.35 or lower.

In step 200, the photolithography masks are formed for use in the photolithography process. The photolithography masks may each be formed to comprise semiconductor patterns, which are component elements of the semiconductor device 190 expressed on a glass substrate. For example, the component elements include active regions 135, gate patterns 150, and landing pad holes 174 in the semiconductor device 190. The mask formation of the invention is limited to forming photolithography masks to express the landing pad holes 174.

A schematic layout of a semiconductor device 190 according to the invention is shown in FIG. 2. Since the landing pad holes 174 comprise an asymmetric pattern in the semiconductor device 190, the pattern of the landing pad holes 174 can be formed from photolithography masks having semiconductor patterns divided into a plurality of pieces in order to provide symmetry and periodicity. To do this, the landing pad holes 174 may be expressed using more than one, e.g., two photolithography masks.

In step 300, a simulation of a photolithography process is performed using the semiconductor patterns of the photolithography masks formed in step 200. The simulation can be performed using a photolithography simulator, such as but not limited to Solid-C (Sigma-C, Munich). The photolithography simulator will display a composite aerial image of a predicted semiconductor pattern that may be formed through the photolithography process on a photoresist layer from a photolithography mask or overlapped photolithography masks.

In step 400, the composite aerial image of the predicted semiconductor pattern from the photolithography simulation can be compared with the design layout of the semiconductor device 190. Physical effects, including optical aberrations that may be generated by the illumination system or the projection optics during the photolithography process may be exhibited in the photolithography simulation. Step 400 confirms whether or not the composite aerial images properly express the pattern of the landing pad holes 174 of the semiconductor device 190 within the tolerance range of its design rule. This is to check that the semiconductor patterns are located at desired points among cross points of horizontal lines and vertical lines on the photolithography masks. If the composite aerial images do not properly express the pattern of the landing pad holes 174 of the semiconductor device 190, the flow chart will not proceed on to step 500 from step 400 according to the "YES" loop of the flow chart as depicted in FIG. 1. Should the composite aerial images improperly express the landing pad holes of the semiconductor device, the flow chart will proceed back to step 300 (simulation performance) or step 200 (mask formation) according to the "NO" loop of the flow chart as depicted in FIG. 1.

Should the composite aerial images from the photolithography simulation properly express the landing pad holes 174 of the semiconductor device 190, the flow chart will proceed to step 500 (semiconductor substrate preparation) from step 400 according to the "YES" loop of the flow chart as depicted in FIG. 1. Thus, the photolithography masks of step 200 can be used for performing a photolithography process in the formation of the semiconductor device 190 according to the invention. To do this, a semiconductor substrate covered with a photoresist layer is prepared in step 500. According to some embodiments of the invention, line patterns and a planarized insulating interlayer covering the patterns are preferably formed between the semiconductor substrate and the photoresist layer. The line patterns are formed to traverse active regions of the semiconductor substrate.

In step 600, the photolithography masks of step 200 transfer semiconductor patterns to the photoresist layer using a photolithography process. The photolithography process can be performed using proper illumination systems together with the photolithography masks. The photolithography process forms the same photoresist pattern as the composite aerial image of step 300 on the planarized insulating interlayer.

In step 700, the planarized insulating interlayer is etched using the photoresist patterns as an etch mask through an etching process. The etching process forms landing pad holes 174 exposing the semiconductor substrate. Further, the flow chart runs across to step 700 (etching process performance) and goes to step 800 (landing-pad process performance). In step 800, the landing pad holes 174 are filled with conductive layers respectively.

Steps 100 and 200 in the flow chart of FIG. 1 will be described in further detail below.

Referring to FIGS. 2 to 4, the landing pad holes 174 are arranged in an asymmetric pattern in the semiconductor device 190. In step 100, the landing pad holes 174 can be divided into a plurality of pieces (first pad holes 170 and second pad holes 172) and formed on two photolithography masks. The two photolithography masks formed in step 200 will be described herein as a first photolithography mask 20 and a second photolithography mask 40 respectively. The first photolithography mask 20 preferably uses a phase shifting mask (PSM). The second photolithography mask 40 preferably uses a PSM or a chromium-on-glass mask (CoG mask).

The first photolithography mask 20 is formed to comprise an opaque region 10 and a plurality of transparent regions 14 as shown in FIG. 3. The transparent regions 14 are formed to be confined by the opaque region 10. The transparent regions 14 comprise the elements that form the first semiconductor pattern 18 on the first photolithography mask 20. The semiconductor pattern 18 is formed on the first photolithography mask 20 with symmetry and periodicity. That is, the elements of the first semiconductor pattern 18 may be formed at the cross points of horizontal lines and vertical lines on the first photolithography mask 20. The semiconductor pattern 18 is preferably formed wherein the individual transparent regions 14 comprising the elements forming the semiconductor pattern 18 have a hole shape and define a hole pattern on the first photolithography mask 20. The transparent regions 14 of the photolithography mask 20 forming the semiconductor pattern 18 are preferably spaced away from each other with predetermined distances S1 and S2 in the horizontal line and the vertical line respectively. Each of the transparent regions 14 comprising the elements forming the first semiconductor pattern 18 are preferably formed to have a predetermined diameter D1.

The second photolithography mask 40 is formed to comprise an opaque region 30 and a plurality of transparent regions 34 as shown in FIG. 4. The transparent regions 34 are formed to be confined by the opaque region 30. The transparent regions 34 form the elements that comprise the second semiconductor pattern 38 on the second photolithography mask 40. The transparent regions 34 comprising the elements forming the second semiconductor pattern 38 may be formed on the second photolithography mask 40 substantially with symmetry and concurrently with periodicity.

The second photolithography mask 40 and the first photolithography mask 20 are preferably overlapped while performing the photolithography process. When overlapped with the first photolithography mask, the transparent regions 34 comprising the elements forming the second semiconductor pattern 38 of the second photolithography mask are disposed on every other (alternate) horizontal line as defined on the first photolithography mask 20. Further, each of the transparent regions 34 that comprising the elements that form the second semiconductor pattern 38 are disposed for every two transparent regions 14 of the semiconductor pattern 18 on the photolithography mask 20 and between adjacent transparent regions 14 comprising the elements that form of the first semiconductor pattern 18. The area occupied by the transparent regions 14 comprising the elements that form the first semiconductor pattern 18 on the photoresist layer is preferably equal to that occupied by the transparent regions 34 comprising the elements that form the second semiconductor pattern 38 on the photoresist layer. Alternatively, the area occupied by the transparent regions 14 that form the semiconductor pattern 18 on the photoresist layer may be different from that occupied by the transparent regions 34 comprising the elements that form the second semiconductor pattern 38 on the photoresist layer.

Further, one of the individual transparent regions 34 comprising the elements that form the second semiconductor pattern 38 are formed to be spaced as to be opposite another individual transparent region 34 on every other horizontal line on which said transparent regions are disposed on the second photolithography mask 40 with a predetermined distance S3 as shown in FIG. 4. Further shown in FIG. 4, the transparent regions 34 comprising the elements that form the second semiconductor pattern 38 is formed to be spaced away from extension lines between adjacent transparent regions 34 comprising the elements of the semiconductor pattern 38 not facing in a horizontal line and a vertical line with determined distances S4 and S5 on the second photolithography mask 40. Two of the transparent regions 34 that comprise the elements forming the semiconductor pattern 38 are formed to be spaced away from each other with a predetermined distance S6 in the horizontal line on the second photolithography mask 40. The semiconductor pattern 38 is preferably formed wherein the individual transparent regions 34 that comprise the semiconductor pattern 38 have a hole shape and define a hole pattern on the second photolithography mask 40. Further, each of the transparent regions 34 of the semiconductor pattern 38 are preferably formed with a predetermined diameter D2.

Step 300 in the flow chart of FIG. 1 will be described in further detail below.

Figure 5:
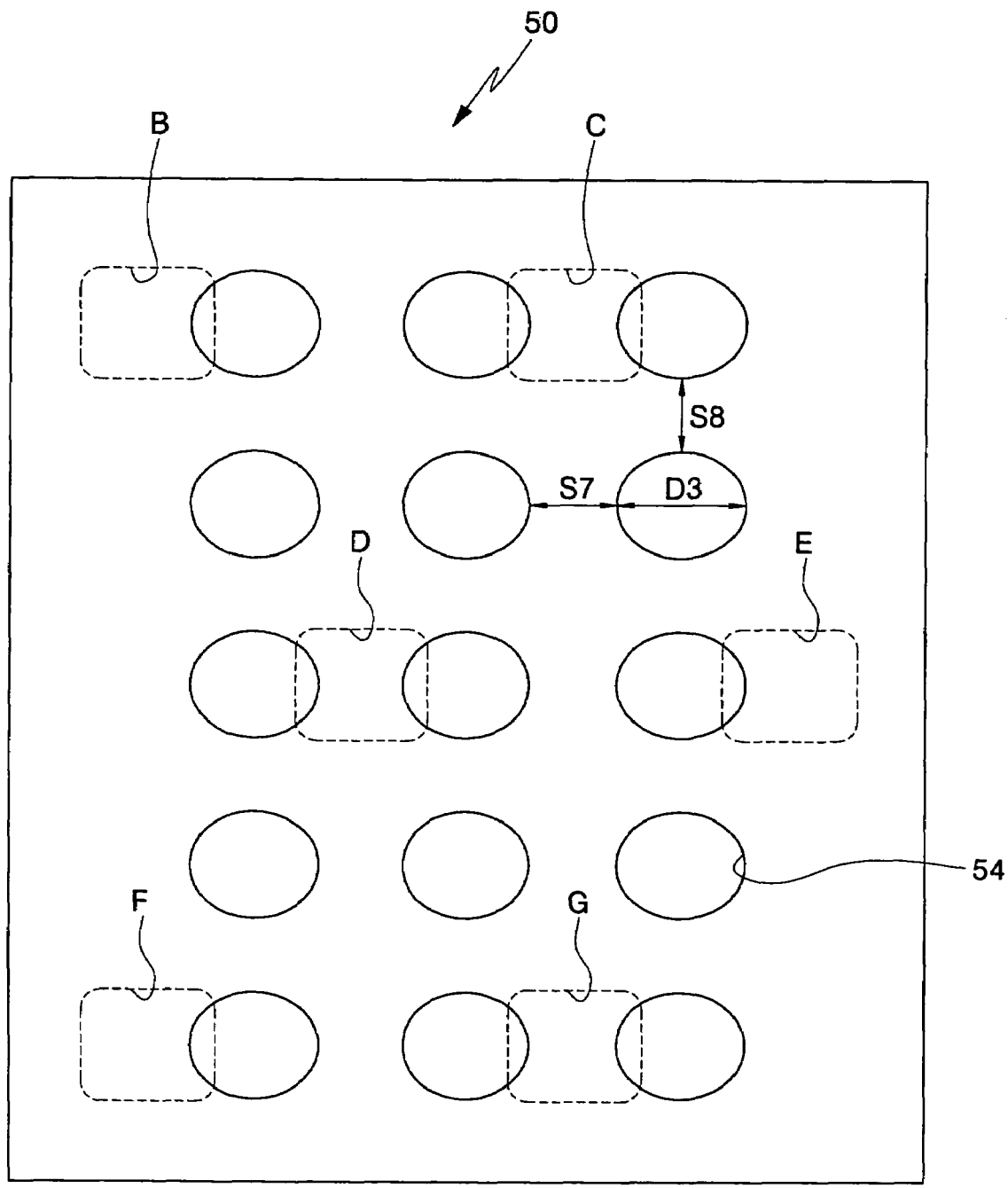
FIG. 5 depicts an aerial image picture illustrating the first photolithography mask of FIG. 3 by using a photolithography simulator.
Figure 6:
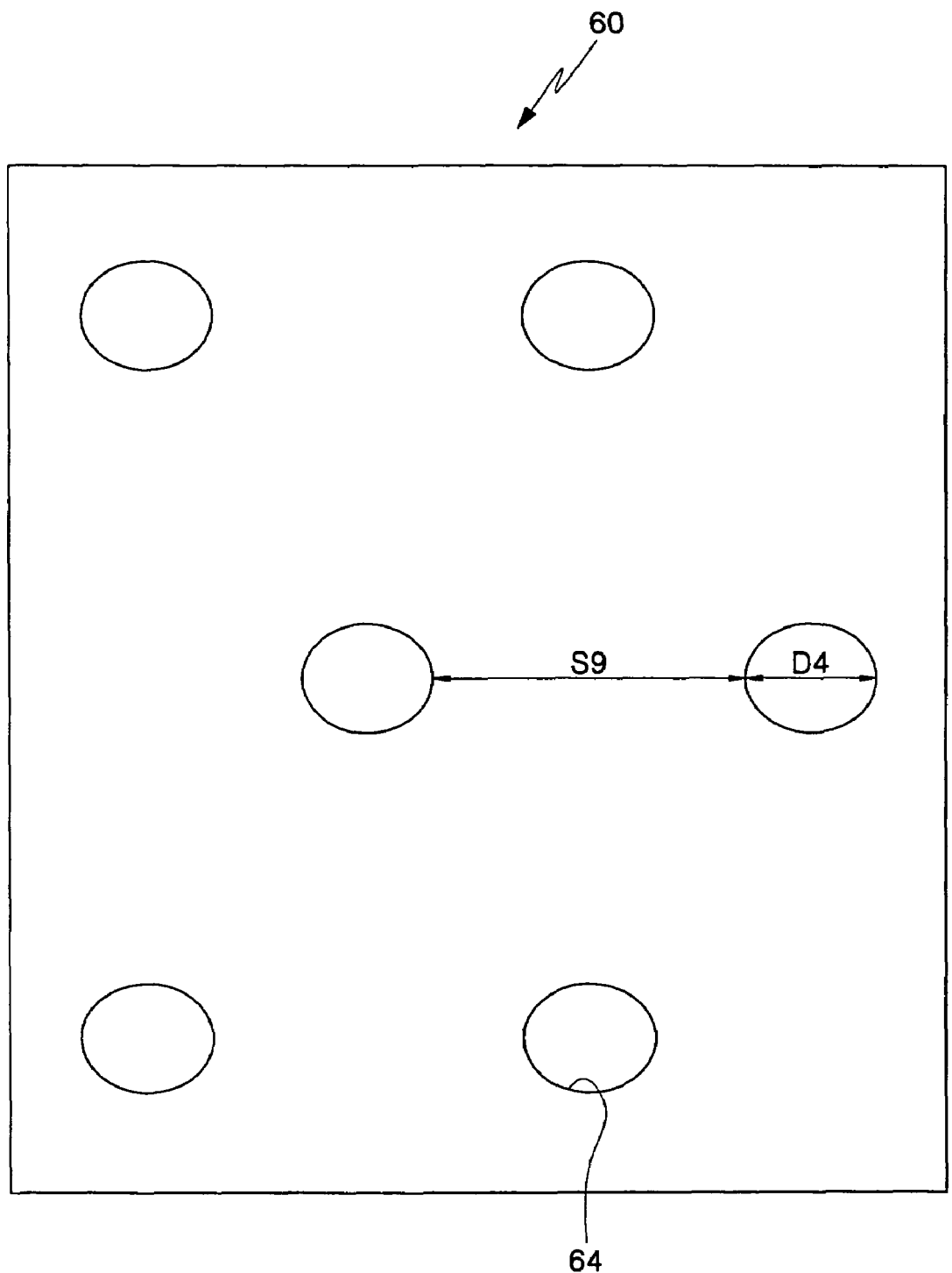
FIG. 6 depicts another aerial image picture illustrating the second photolithography mask of FIG. 4 by using a photolithography simulator.

FIG. 5 depicts a first aerial image picture illustrating the semiconductor pattern of the first photolithography mask 30 of FIG. 3 generated by using a photolithography simulator, and FIG. 6 depicts a second aerial image picture illustrating the second photolithography mask 40 of FIG. 4 generated by using a photolithography simulator.

Referring to FIGS. 3 to 6, in step 300, a photolithography simulation is performed using data of the first photolithography mask 20 and the second photolithography mask 40. The simulation is preferably performed using a photolithography simulator, such as but not limited to Solid-C. The photolithography simulator performs a simulation assuming that a photoresist layer is formed on a semiconductor substrate. The first photolithography mask 20 has the first semiconductor pattern 18 with symmetry and periodicity.

The photolithography simulator is used to simulate the first semiconductor pattern 18 using the first photolithography mask 20 and an off-axis illumination system to form a first aerial image picture 50. The first aerial image picture 50 is assumed to form on the photoresist layer, which is formed on the semiconductor substrate. The first photolithography mask 20 preferably uses a phase shift mask. The off-axis illumination system may be but is not limited to an annular illumination system or a quadrupole illumination system. The first aerial image picture 50 is formed to comprise a plurality of first aerial images 54, which are arranged in two dimensions with symmetry and periodicity. The first aerial images 54 are formed to be spaced away from each other with predetermined distances S7 and S8 on horizontal lines and vertical lines on which the first aerial images 54 are disposed. Each of the aerial images 54 is preferably formed to have a predetermined diameter D3.

The photolithography simulator further performs a simulation for the second photolithography mask 40. The photolithography simulator may simulate the second semiconductor pattern 38 using the second photolithography mask 40 and an on-axis illumination system having a lower value of sigma ($\sigma$) to form a second aerial image picture 60. The second aerial image picture 60 is assumed to form on the photoresist layer, which is formed on the semiconductor substrate. The second aerial image picture 60 is formed to have a plurality of second aerial images 64, which are arranged with asymmetry and periodicity. Two of the individual second aerial images 64 are formed to be spaced away from each other in horizontal lines with a predetermined distance S9. Each of the individual second aerial images 64 preferably has a predetermined diameter D4.

In the case that the second photolithography mask 40 is a phase shift mask, the photolithography simulator preferably uses an off-axis illumination system. The off-axis illumination system may be but is not limited to an annular illumination system or a quadrupole illumination system. Alternatively, in the case that the second photolithography mask 40 is a CoG mask, the photolithography simulator preferably uses an on-axis illumination system. The on-axis illumination system may be a circular illumination system.

Step 400 will be described in further detail together with the step 300 according to the flow chart of FIG. 1 below.

Figure 7:
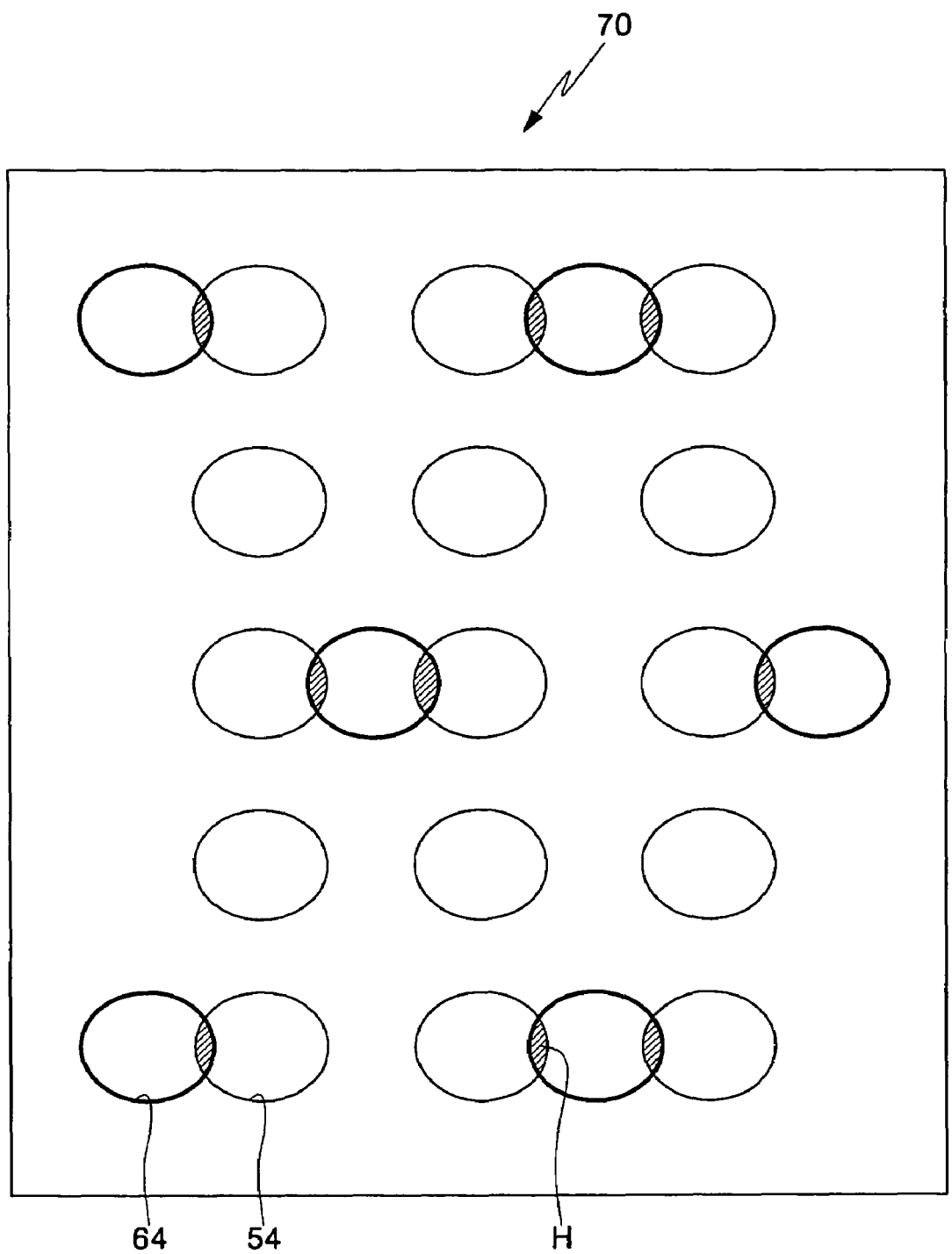
FIG. 7 depicts a self-alignment aerial image picture illustrating the aerial image pictures of FIGS. 5 and 6 by using a photolithography simulator.

FIG. 7 depicts a self-alignment aerial image picture 70 illustrating the first and second aerial image pictures of FIGS.

Figure 8:
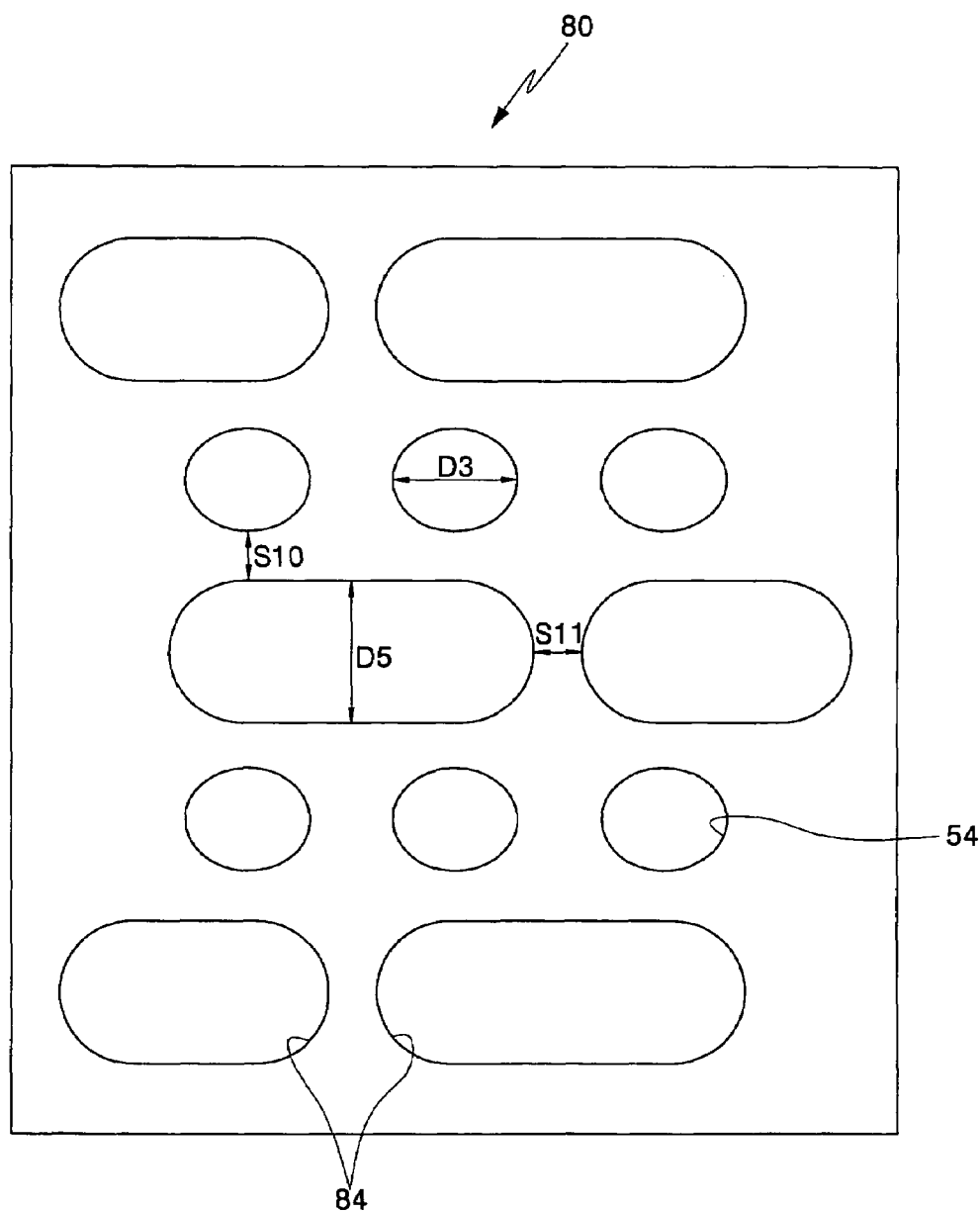
FIG. 8 depicts a composite aerial image picture transforming the self-alignment aerial image picture of FIG. 7 by using a photolithography simulator.

5 and 6 generated by a photolithography simulator, and FIG. 8 is a composite aerial image picture 80 transforming the self-alignment aerial image picture of FIG. 7 generated by a photolithography simulator.

Referring to FIGS. 5 to 8, and further in the step 300, the photolithography simulator may generate a self-alignment aerial image picture 70 by overlapping the second aerial image picture 60 on the first aerial image picture 50. The self-alignment aerial image picture 70 may be generated by disposing the second aerial images 64 of the second aerial image picture 60 on B through G regions of the first aerial image picture 50 using a photolithography simulator. The self-alignment aerial image picture 70 is preferably formed to have cross regions H with a predetermined area by overlapping the first aerial images 54 and the second aerial images 64. The self-alignment aerial image picture 70 is assumed to form on a photoresist layer.

The photolithography simulator may then form a composite aerial image picture 80 using the first aerial images 54 and the second aerial images 64 on the self-alignment aerial image picture 70. The composite aerial image picture 80 is assumed to form on the photoresist layer by transforming the self-alignment aerial image picture 70. Thus, the composite aerial image picture 80 is formed to comprise a plurality of third aerial images 84 by controlling an exposure time and an exposure amount while overlapping the first aerial images 54 and the second aerial images 64 on the self-alignment aerial image picture 70 in addition to a plurality of remaining first aerial images 54.

The third aerial images 84 are preferably formed by combining some portion of the first aerial images 54 and the second aerial images 64 on the self-alignment aerial image picture 70. Further, the composite aerial image picture 80 is preferably formed to have the remaining aerial images 54, which are the first aerial images 54 not overlapping with the second aerial images 64, together with the third aerial images 84. The third aerial images 84 and the remaining aerial images 54 are preferably spaced away from each other with a predetermined distance S10 on a vertical line, and two of the third aerial images 84 are preferably spaced away from each other with a predetermined distance S11 on a horizontal line. Each of the third aerial images 84 preferably have a predetermined diameter D5 in a direction facing the remaining aerial images 54.

As a result, since the composite aerial image picture 80 may be formed on the photoresist layer with the first photolithography mask 20 and the second photolithography mask 40 while performing a photolithography process, it must be considered sufficiently in advance in the step 200 of the mask formation as shown in FIG. 1. Thus, in the step 400 of a simulation result check, if the composite aerial image picture 80 properly expresses the landing pad holes 174 on the design layout of the semiconductor device 190, the photolithography process can be performed using the first photolithography mask 20 and the second photolithography mask 40. Thus, the first photolithography mask 20 and the second photolithography mask 40 may form the landing pad holes 174 using the remaining aerial images 54 and the third aerial images 84 on the photoresist layer without interfering with the design rule. This results in simplification of a semiconductor fabrication process over the prior art, thereby overcoming the design rule.

Steps 500, 600, 700 and 800 in a flow chart of FIG. 1 will be described in further detail with the first photolithography mask 20 and the second photolithography mask 40 below.

Figure 9:
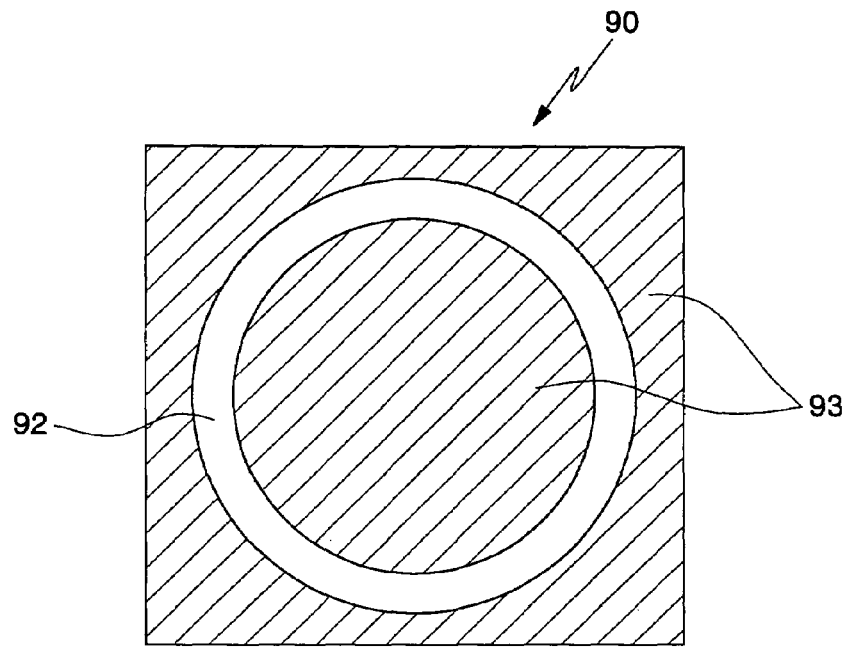
FIGS. 9 and 10 depict top plan views illustrating off-axis illumination systems respectively.
Figure 10:
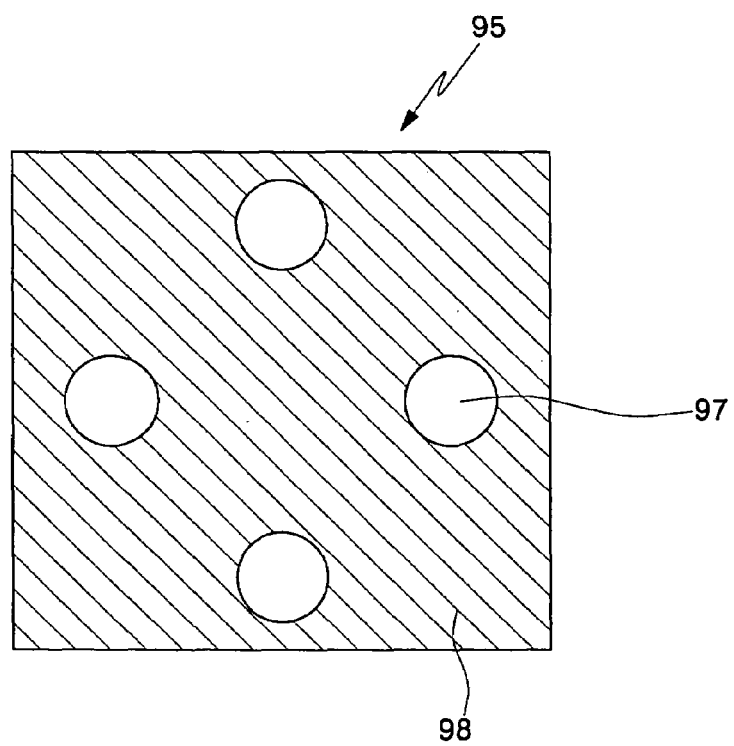
Figure 11:
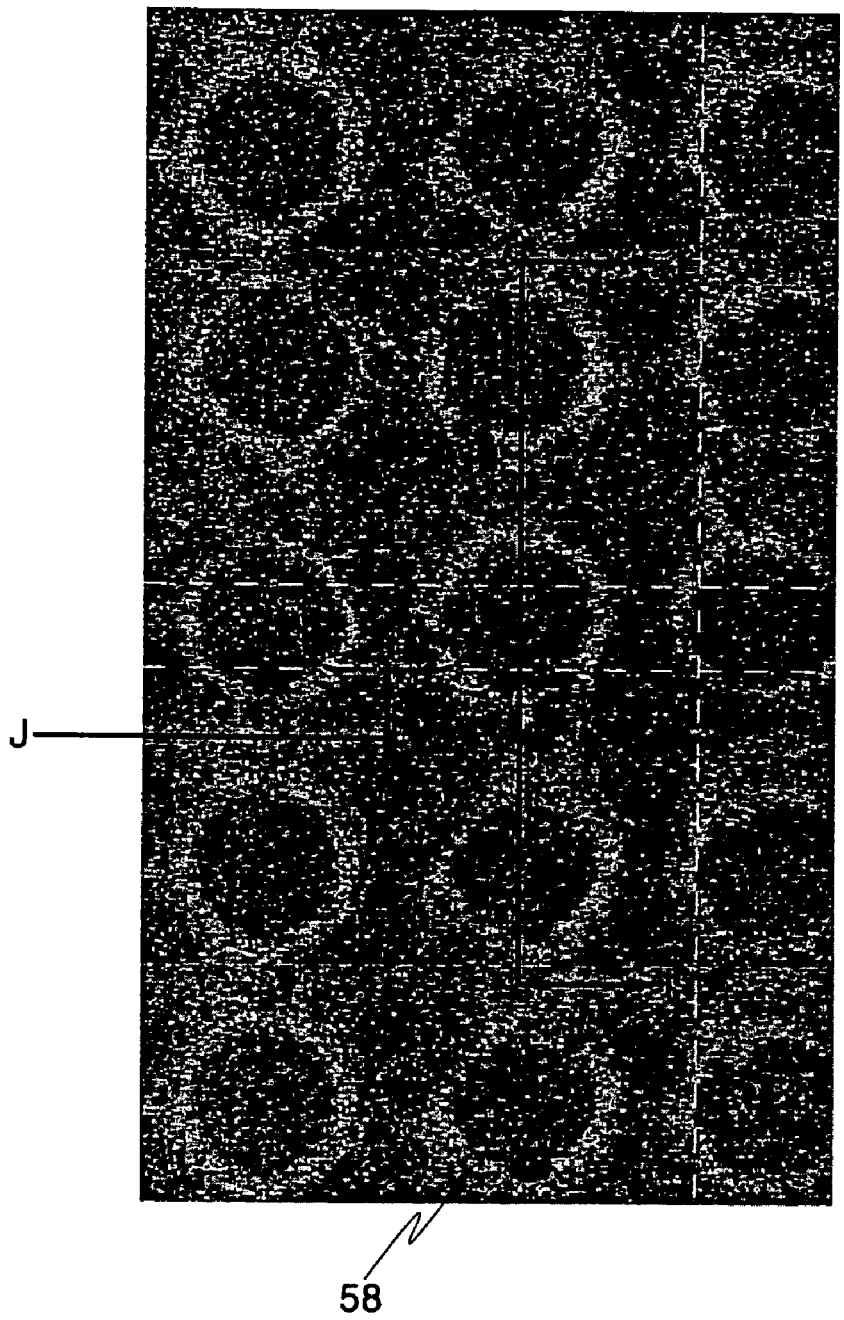
FIG. 11 depicts a photolithograph illustrating a first photoresist pattern corresponding to the first photolithography mask of FIG. 3.
Figure 12:
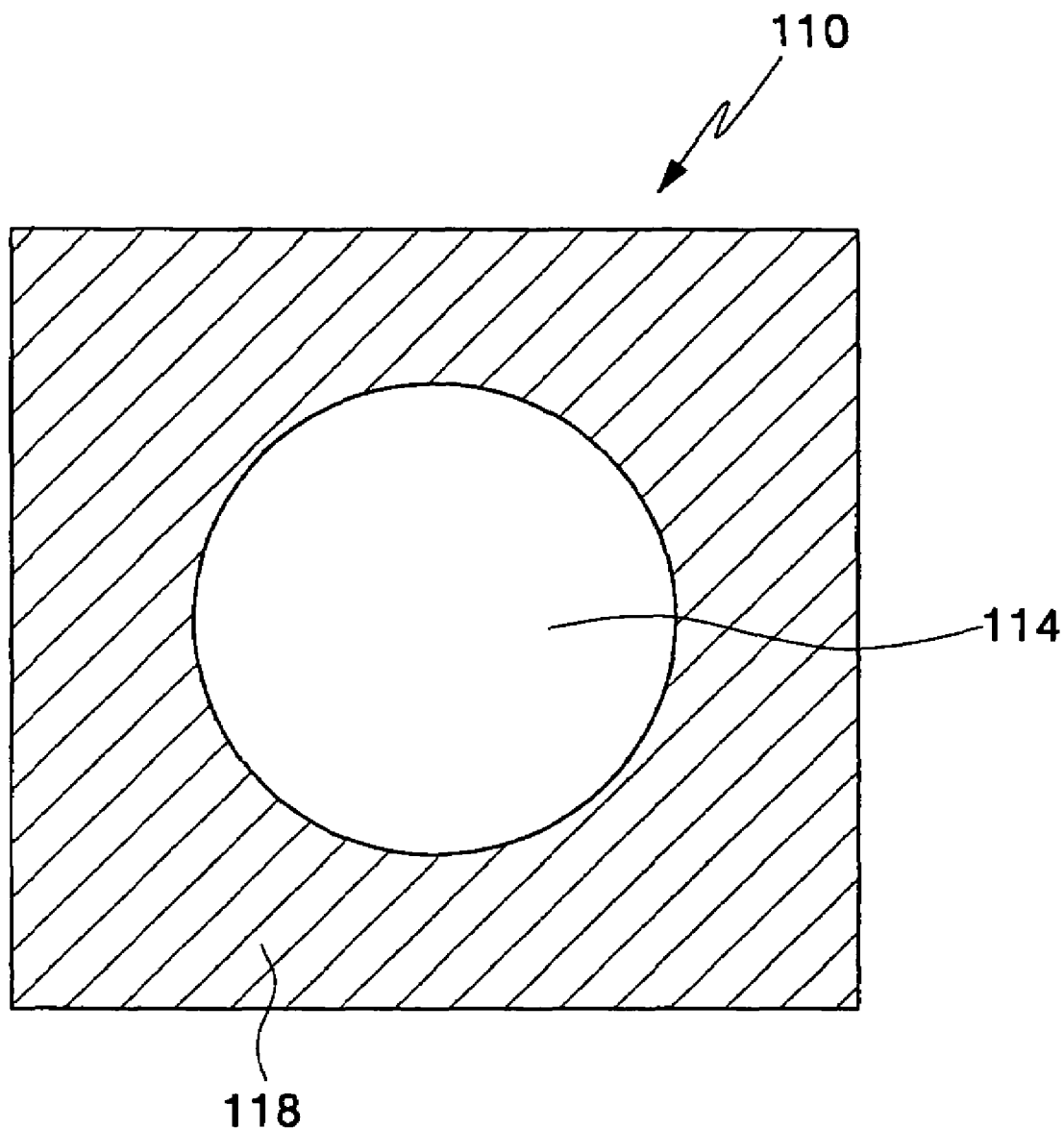
FIG. 12 depicts a top plan view illustrating an on-axis illumination system.
Figure 13:
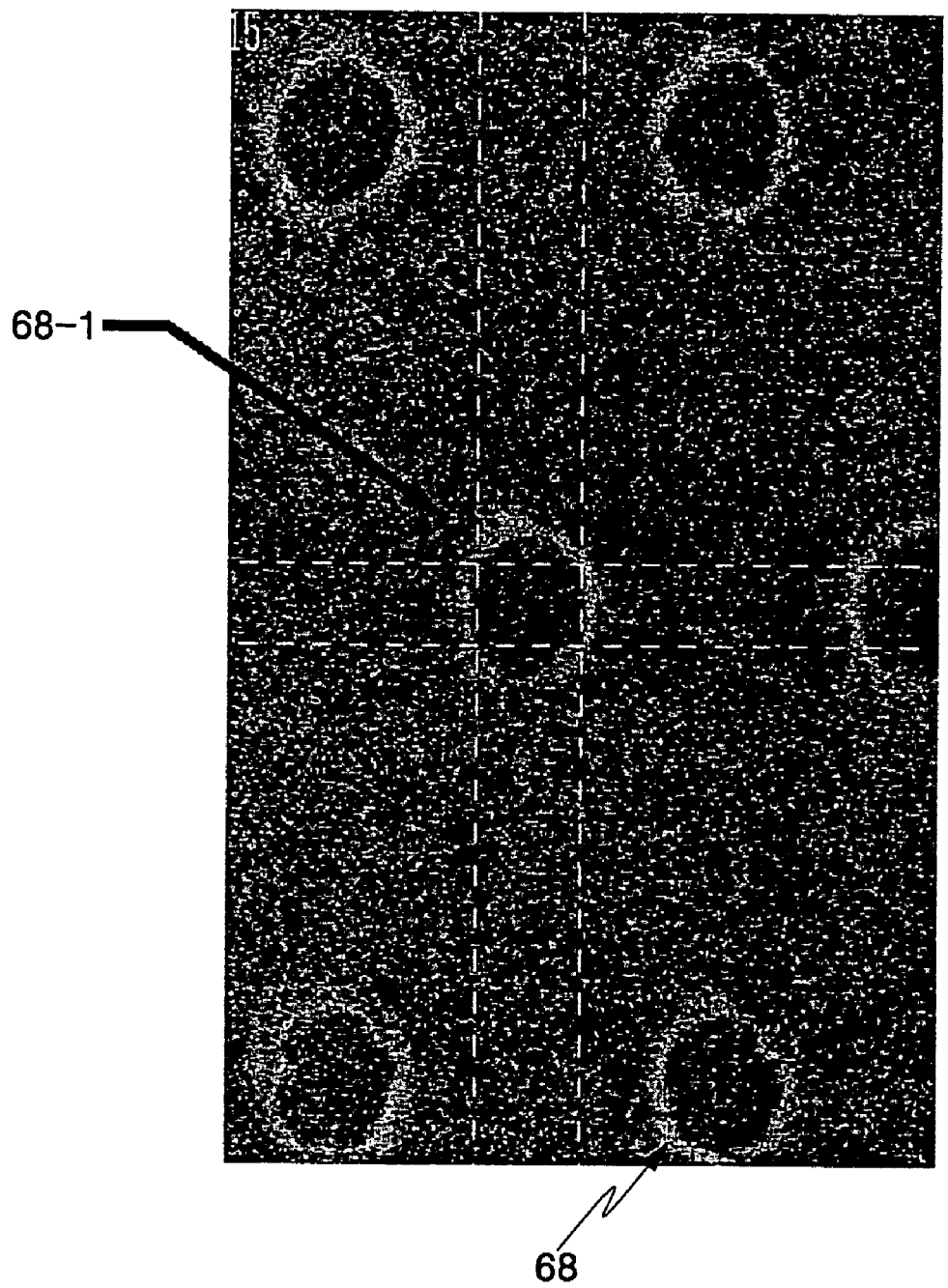
FIG. 13 depicts a photolithograph illustrating a second photoresist pattern corresponding to the second photolithography mask of FIG. 4.
Figure 14:
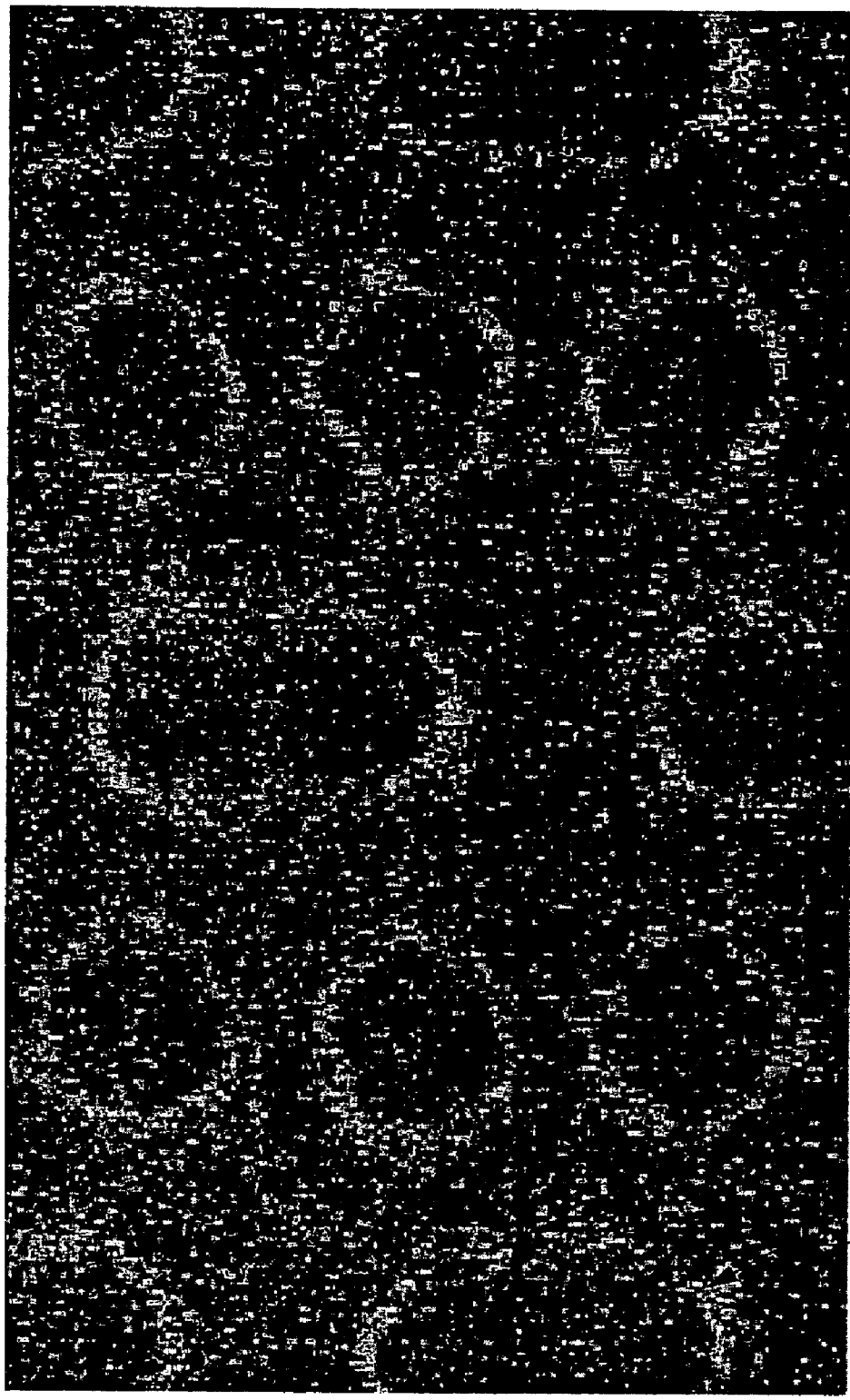
FIG. 14 depicts a photolithograph illustrating a third photoresist pattern formed by overlapping the photoresist patterns of FIGS. 11 and 13.

FIGS. 9 and 10 are top plan views illustrating off-axis illumination systems respectively. FIG. 11 depicts a photolithograph illustrating a first photoresist pattern corresponding to the first photolithography mask of FIG. 3. Further, FIG. 12 is a top plan view illustrating an on-axis illumination system, and FIG. 13 is a photolithograph illustrating a second photoresist pattern corresponding to the second photolithography mask of FIG. 4. Also, FIG. 14 is a photolithograph illustrating a third photoresist pattern by overlapping the photoresist patterns of FIGS. 11 and 13, and FIGS. 15 to 20 are cross-sectional views illustrating a method of forming a semiconductor device according to the invention.

Figure 15:
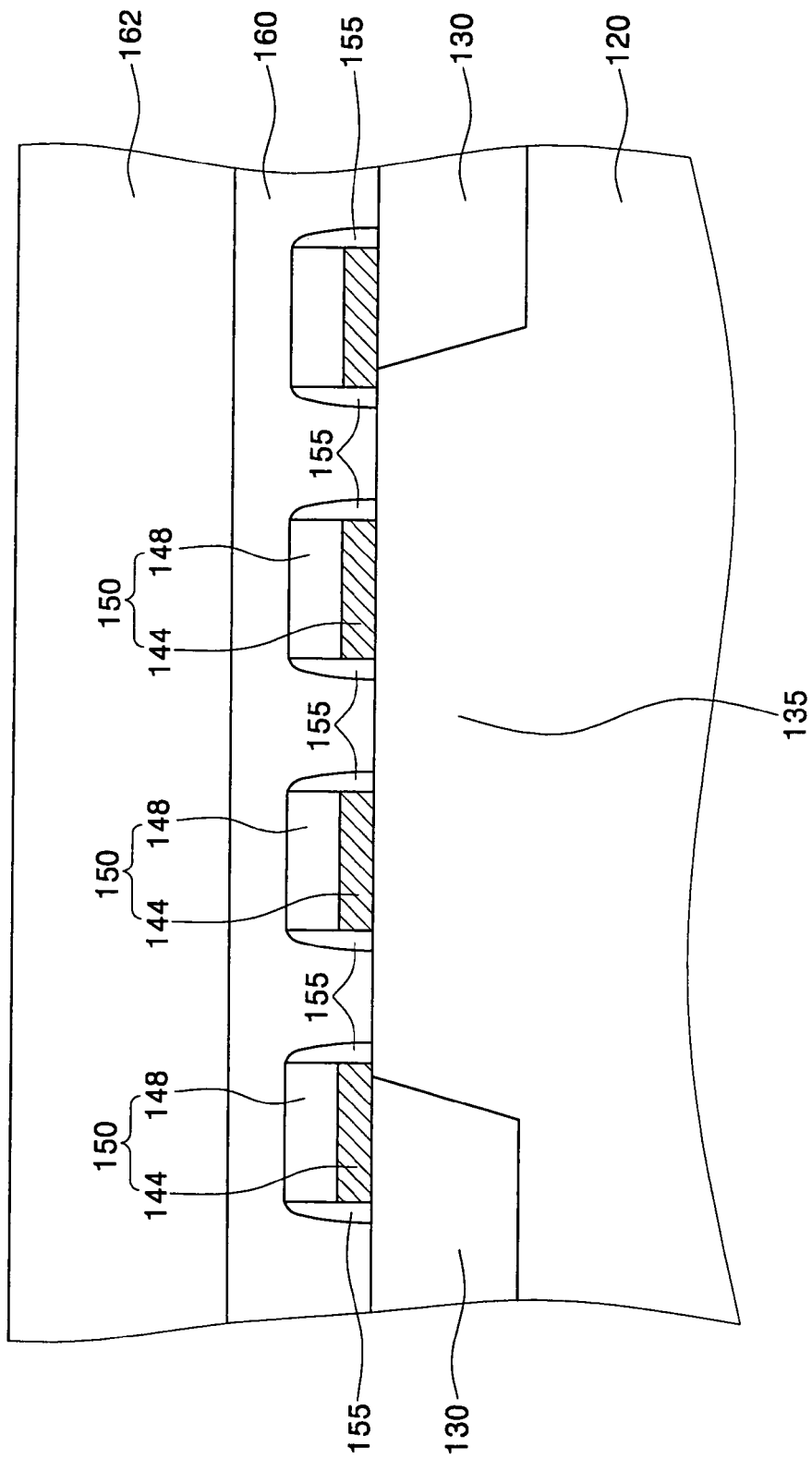
FIGS. 15 to 20 depict cross-sectional views illustrating a method of forming a semiconductor device according to the invention.

Referring to FIGS. 2 and 3, FIGS. 9 to 11, and FIGS. 15 and 16, in step 500, an isolation layer 130 is formed in a semiconductor substrate 120. The isolation layer 130 is formed to isolate a plurality of active regions 135 as shown in FIG. 15. Line patterns 150 are formed to traverse the active regions 135. The line patterns 150 will be referred to as "gate patterns." Each of the gate patterns 150 is preferably formed using a gate 144 and a gate capping layer pattern 148, which are sequentially stacked. Gate spacers 155 are formed on sidewalls of the gate patterns 150 respectively. A planarized insulating interlayer 160 and a photoresist layer 162 are sequentially formed on the semiconductor substrate 120 to cover the gate patterns 150.

Figure 16:
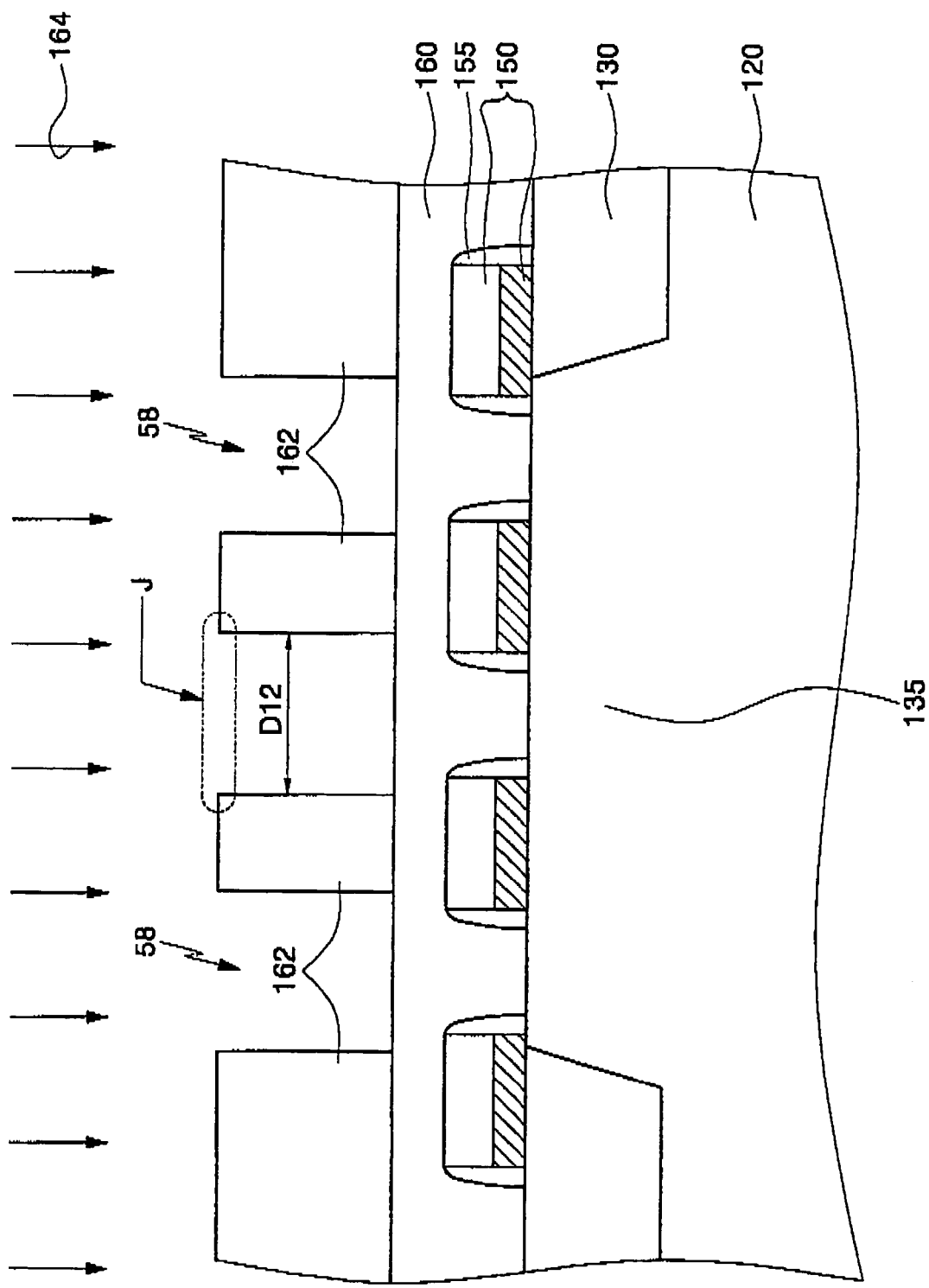

In step 600, a photolithography process 164 is performed on the photoresist layer 162 as shown in FIG. 16. The photolithography process 164 can be performed using the first photolithography mask 20 of FIG. 3 and an off-axis illumination system. The off-axis illumination system preferably uses an annular illumination system 90 of FIG. 9 or a quadrupole illumination system 95 of FIG. 10. The quadrupole illumination system 95 is preferably formed to have transparent regions 97 disposed in a horizontal line and a vertical line about the center thereof respectively, and an opaque region 98 confining the transparent regions 97. The annular illumination system 90 is preferably formed to have an annular-shaped transparent region 92 and an opaque region 93 confining the transparent region 92. The first photolithography mask 20 is formed to have the semiconductor pattern 18 with symmetry and periodicity. That is, the semiconductor pattern 18 is respectively disposed at cross points of horizontal lines and vertical lines of the first photolithography mask 20. The semiconductor pattern 18 is preferably formed to define a hole pattern.

The photolithography process 164 transfers the first semiconductor pattern 18 of the first photolithography mask 20 to the photoresist layer 162, thereby forming the elements that comprise the first photoresist pattern 58 of FIG. 11 with symmetry and periodicity on the photoresist layer 162. FIG. 16 depicts the structure on which the first photoresist pattern 58 is formed taken along a line of I-I' of FIG. 11. The first photoresist pattern 58 is preferably formed on a planarized insulating interlayer 160 between gate patterns 150 respectively. Specifically, the elements of the first photoresist pattern 58 are preferably disposed respectively on predetermined regions of the planarized insulating interlayer 160, which is on an isolation layer 130. The first photoresist pattern 58 formed by the first photolithography mask 20 corresponds to transparent regions 14 of the first photolithography mask 20, and is preferably formed to have a predetermined diameter D12.

Referring to FIG. 2, FIG. 4, FIGS. 12 to 14 and FIG. 17, and further in step 600, a photolithography process 166 is performed on the photoresist layer 162. The photolithography process 166 may be performed using the second photolithography mask 40 of FIG. 4 and an on-axis illumination system. The on-axis illumination system preferably uses an annular illumination system 110 of FIG. 12. The annular illumination system 110 is preferably formed to have an annular-shaped transparent region 114 and an opaque region 118 confining the transparent region 114. Further, the second photolithography mask 40 preferably uses a CoG mask. The second photolithography mask 40 is formed to have the second semiconductor pattern 38 with symmetry and periodicity. The photolithography process 166 transfers the second semiconductor pattern 38 of the second photolithography mask 40 to the photoresist layer 162 to form elements comprising the second photoresist pattern 68 of FIG. 13 on the planarized insulating interlayer 160. The area occupied by the second semiconductor pattern 38 on the photoresist layer 162 is preferably equal to that occupied by the first semiconductor pattern 18 of FIG. 3 on the photoresist pattern 162. Alternatively, the area occupied by the second semiconductor pattern 38 on the photoresist layer 162 may be different from that occupied by the first semiconductor pattern 18 of FIG. 3 on the photoresist pattern 162.

An element 68-1 of the second photoresist pattern 68 is preferably formed between elements of the first photoresist pattern 58 aligned with region J as depicted in FIG. 11. The elements comprising the second photoresist pattern 68 are preferably formed to be disposed on every other horizontal line of FIG. 11 on which elements comprising the first photoresist pattern 58 are disposed. Further, individual elements comprising the second photoresist pattern 68 formed by the second photolithography mask 40 corresponds to transparent regions 34 of second photolithography mask 40, which are preferably disposed for every two elements of the first photoresist pattern 58 on every other horizontal line of FIG. 11 on which elements comprising the first photoresist pattern 58 are disposed and disposed between adjacent elements of the first photoresist pattern 58.

The photolithography process 166 forms elements of a third photoresist pattern 88 of FIG. 14 in the photoresist layer 162 by controlling an exposure time and an exposure amount using some portion of the photoresist pattern 58 and the second photoresist pattern 68. That is, elements of the third photoresist pattern 88 are formed by combining elements of the photoresist pattern 58 aligned with region J of FIG. 11 or FIG. 16, and element 68-1 of the second photoresist pattern 68 during performing the photolithography process 166. This corresponds to the composite aerial image picture 80 of FIG. 8 on the photoresist layer 162, using the first photolithography mask 20 and the second photolithography mask 40 while performing the photolithography process 166.

Figure 17:
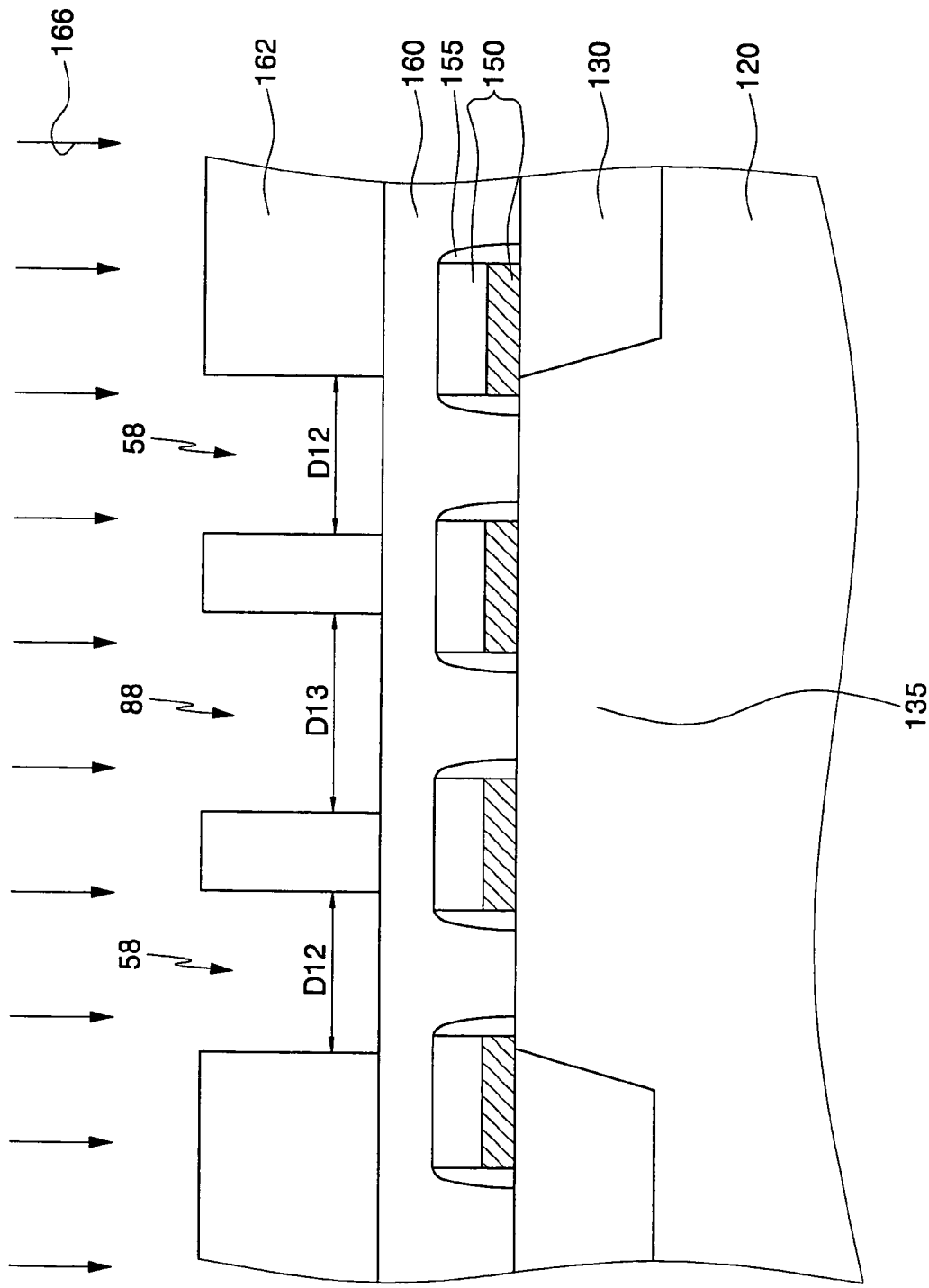

As a result, there is formed a cross-sectional view of FIG. 17 in the case that the first photoresist pattern 58 and the third phototresist pattern 88 of FIG. 14 is taken along the same line as the line I-I' of FIG. 11. The third photoresist pattern 88 is preferably formed on the planarized insulating interlayer 160 between the gate patterns 150. In specific, the third photoresist pattern 88 may be respectively formed at predetermined regions on the planarized insulating interlayer 160. The elements of the third photoresist pattern 88 are formed between the remaining elements of the first photoresist pattern 58 on one active region 135. The third photoresist pattern 88 is preferably formed to a predetermined diameter D13.

Figure 18:
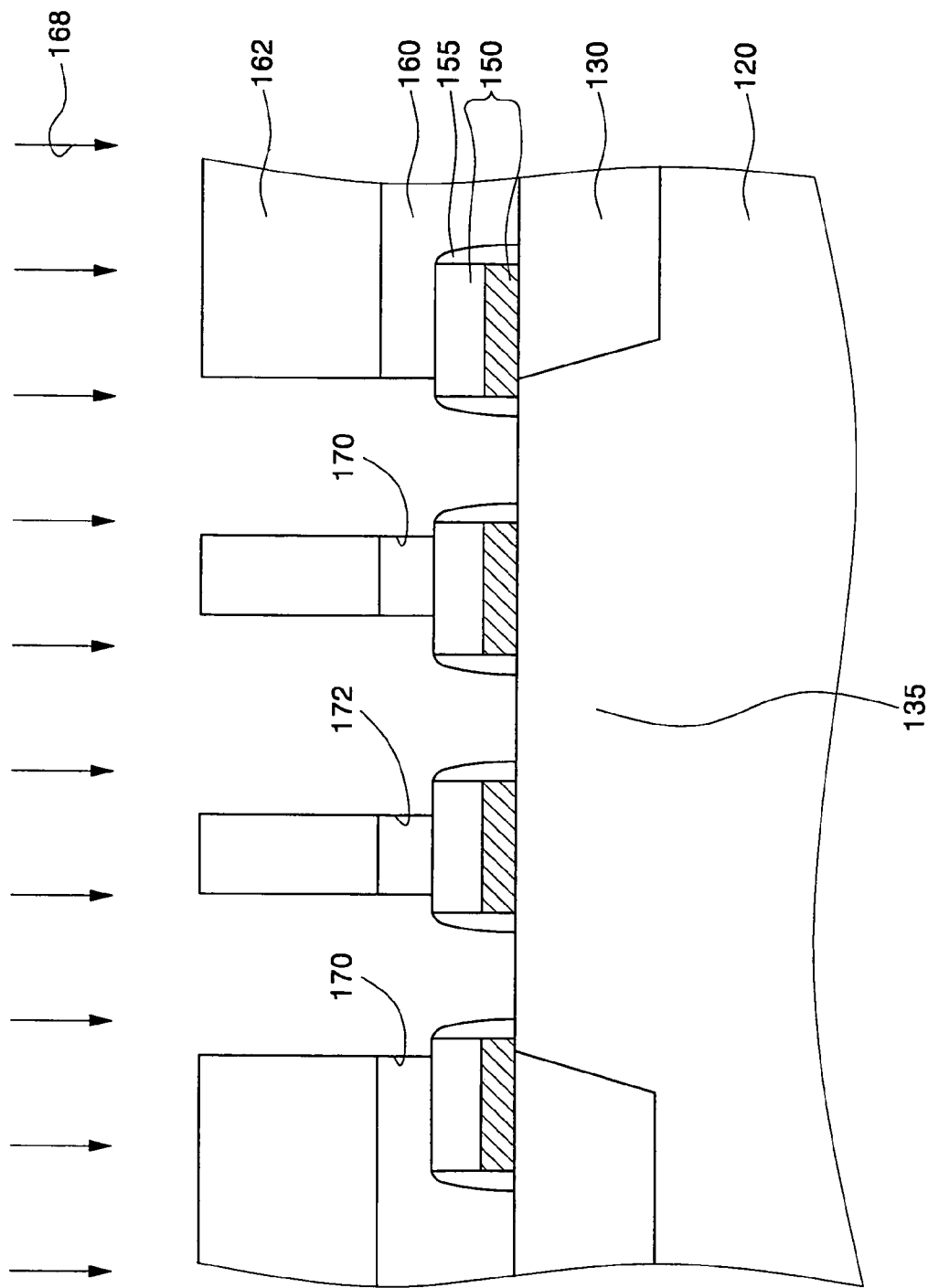
Figure 19:
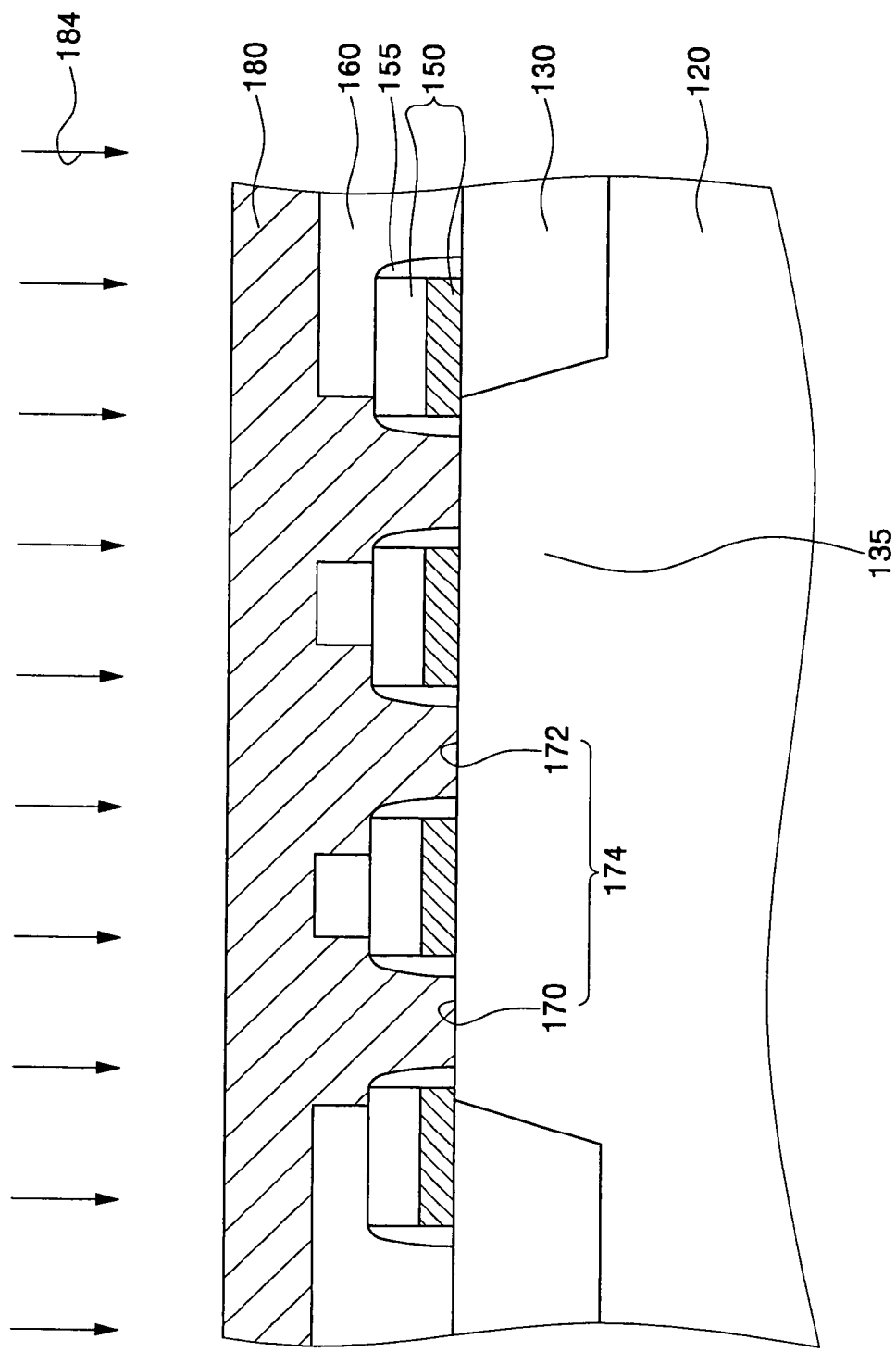
Figure 20:
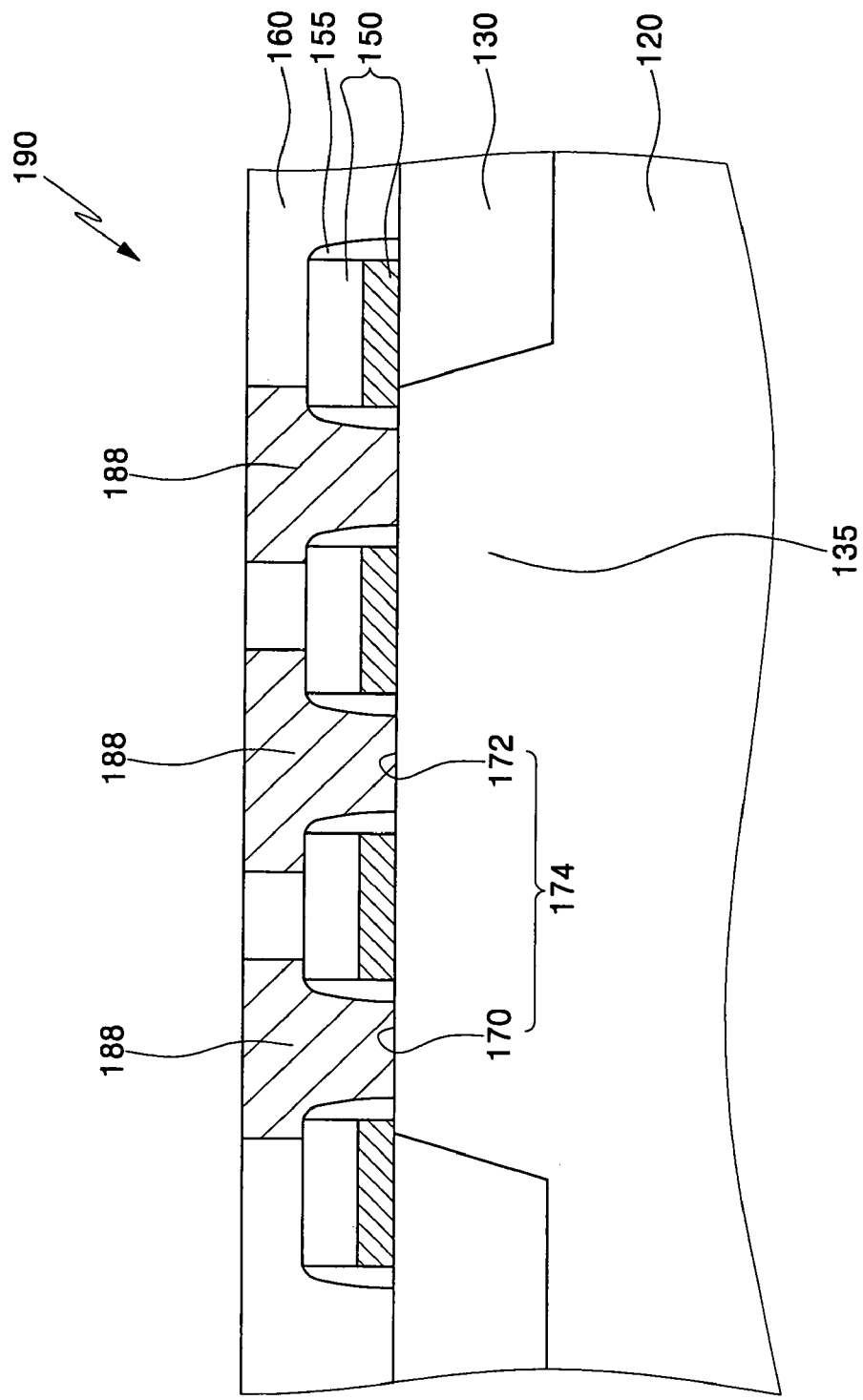

Referring to FIGS. 18 to 20, in step 700, an etching process 168 is performed on the planarized insulating interlayer 160 through the third photoresist pattern 88 and the first photoresist pattern 58, using the photoresist layer 162 as an etch mask. The etching process 168 can form first pad holes 170 and second pad holes 172 on the semiconductor substrate 120 corresponding to elements of the first photoresist pattern 58 and the third photoresist pattern 88, respectively. The first pad holes 170 and the second pad holes 172 expose the gate patterns 150, the gate spacers 155 and the semiconductor substrate 120. Each of the first pad holes 170 and each of the second pad holes 172 form one landing pad hole 174 as shown in FIG. 19. After the formation of the first pad holes 170 and the second pad holes 172 are formed, the photoresist layer 162 is removed from the semiconductor substrate 120.

In step 800, a landing pad layer 180 is formed on the planarized insulating interlayer 160 to fully fill the first pad holes 170 and the second pad holes 172. The landing pad layer 180 is preferably formed of a conductive layer, for example, $N^+$-type polysilicon layer. A planarization process 184 is continuously performed on the landing pad layer 180. The planarization process 184 is preferably performed until the planarized insulating interlayer 160 is exposed. The planarization process 184 forms landing pads 188 filling the first pad holes 170 and the second pad holes 172 respectively. The planarization process 184 is preferably performed using a chemical mechanical polishing and an etching-back.

The foregoing is illustrative of the present invention, and is not to be construed as limiting thereof. The invention is defined by the following claims, with equivalents of the claims to be included therein.

What is claimed is:

1. A method of performing a photolithography process for forming asymmetric semiconductor patterns comprising:
   A) forming a photoresist layer on a semiconductor substrate;
   B) transferring a first photolithography mask to the photoresist layer, the first photolithography mask comprising elements that form a first semiconductor pattern, wherein said pattern is disposed at cross points of horizontal lines and vertical lines on said photolithography mask; and
   C) transferring a second photolithography mask to the photoresist layer, the second photolithography mask comprising elements that form a second semiconductor pattern, which is disposed on every other horizontal line of the first photolithography mask, wherein individual elements that form the second semiconductor pattern are disposed for every two elements of the first semiconductor pattern in every other horizontal line on the first photolithography mask and disposed between adjacent elements of the first semiconductor patterns, wherein the first photolithography mask and the second photolithography mask transfer a composite aerial image of the first semiconductor pattern and the second semiconductor pattern that define the asymmetric semiconductor pattern to the photoresist layer in two dimensions during performing the photolithography process.

2. The method according to claim 1, wherein the elements of the first semiconductor pattern and elements of the second semiconductor pattern are formed to have a hole shape.

3. The method according to claim 1, wherein the area occupied by the first semiconductor pattern on the photoresist layer is equal to that occupied by the second semiconductor pattern on the photoresist layer.

4. The method according to claim 1, wherein the area occupied by the first semiconductor pattern on the photoresist layer is different from that occupied by the second semiconductor pattern on the photoresist layer.

5. The method according to claim 1, wherein the first photolithography mask and the second photolithography mask use a phase shifting mask (PSM).

6. The method according to claim 1, wherein the second photolithography mask uses a chromium-on-glass mask (CoG mask).

7. The method according to claim 1, further comprising, during the transferring the first photolithography mask to the photoresist layer, using an off-axis illumination system in order to transfer the first semiconductor pattern to the photoresist layer.

8. The method according to claim 1, further comprising, during the transferring the second photolithography mask to the photoresist layer, using an on-axis illumination system in order to transfer the second semiconductor pattern to the photoresist layer.

9. A method of forming semiconductor devices using a method of performing a photolithography process for forming asymmetric semiconductor patterns, the method comprising:
   A) preparing a semiconductor substrate having an isolation layer disposed therein, the isolation layer being formed to isolate a plurality of active regions;
   B) sequentially forming a planarized insulating interlayer and a photoresist layer on an overall surface of the semiconductor substrate;
   C) transferring a first semiconductor pattern of a photolithography mask to the photoresist layer, thereby forming a first photoresist pattern on predetermined regions of the planarized insulating interlayer respectively;
   D) transferring a second semiconductor pattern of a second photolithography mask to the photoresist layer, thereby forming a second photoresist pattern on predetermined regions of the planarized insulating interlayer respectively; and
   E) performing an etching process on the planarized insulating interlayer to expose the semiconductor substrate, using the first photoresist pattern and the second photoresist pattern as an etch mask,
wherein the first photolithography mask is formed to have elements of the first semiconductor pattern at cross points of horizontal lines and vertical lines thereof, and the second photolithography mask is formed to have elements of the second semiconductor pattern, and wherein elements of the second semiconductor pattern are formed to be disposed on every other horizontal line on the first photolithography mask, wherein individual elements of the second semiconductor pattern are formed to be disposed for every two elements of the first semiconductor pattern on every other horizontal line of the first photolithography mask and disposed between adjacent elements of the first semiconductor pattern.

10. The method according to claim 9, wherein the first semiconductor pattern and the second semiconductor pattern are formed to have a hole shape.

11. The method according to claim 9, wherein the area occupied by the first semiconductor pattern on the photoresist layer is equal to that occupied by the second semiconductor pattern on the photoresist layer.

12. The method according to claim 9, wherein the area occupied by the first semiconductor pattern on the photoresist layer is different from that occupied by the second semiconductor pattern on the photoresist layer.

13. The method according to claim 9, wherein the first photolithography mask and the second photolithography mask use a phase shifting mask (PSM).

14. The method according to claim 9, wherein the second photolithography mask uses a chromium-on-glass mask (CoG mask).

15. The method according to claim 9, further comprising, during the transferring the first photolithography mask to the photoresist layer, using an off-axis illumination system in order to transfer the first semiconductor pattern to the photoresist layer.

16. The method according to claim 9, further comprising, during the transferring the second photolithography mask to the photoresist layer, using an on-axis illumination system in order to transfer the second semiconductor patterns to the photoresist layer.

17. The method according to claim 9, further comprising forming line patterns between the semiconductor substrate and the planarized insulating interlayer, wherein the line patterns are formed to traverse the active regions, and the first photoresist pattern and the second photoresist pattern are formed on the line patterns.

18. The method according to claim 9, after performing an etching process, further comprising removing the photoresist layer from the semiconductor substrate.

19. A method of performing a photolithography process for forming asymmetric semiconductor patterns comprising:
   A) forming a first semiconductor pattern using a first photolithography mask; and
   B) forming a second semiconductor pattern using a second photolithography mask to transfer an asymmetric semiconductor pattern to a photoresist layer in two dimensions;
      wherein the first semiconductor pattern comprises a plurality of first elements, the second semiconductor pattern comprises a plurality of second elements, the photoresist layer comprises aerial images of a subset of the first elements, and aerial images of remaining first elements and the second elements, alternately and repeatedly on different lines of extensions connecting the plurality of first elements in parallel to a selected direction; and
      wherein the aerial images of the remaining first elements and the second elements are partially combined on selected lines of the photoresist layer to have shapes other than the aerial images of the subset of first elements on other lines of the photoresist layer.

20. The method according to claim 19, wherein the plurality of second elements of the second semiconductor pattern overlap a portion of the first elements of the first semiconductor pattern of the photoresist layer.

21. The method according to claim 19, wherein each of the combined aerial images of the remaining first elements and the second elements have an area larger than each of the aerial images of the subset of first elements.

22. The method according to claim 19, wherein the asymmetric semiconductor pattern comprises the subset of first elements and a combination of remaining first elements and the second elements.

23. The method according to claim 19, wherein the first photolithography mask and the second photolithography mask use a phase shifting mask (PSM).

24. The method according to claim 19, wherein the second photolithography mask uses a chromium-on-glass mask (CoG mask).

25. The method according to claim 19, further comprising, during the transferring the first photolithography mask to the photoresist layer, using an off-axis illumination system in order to transfer the first semiconductor pattern to the photoresist layer.

26. The method according to claim 19, further comprising, during the transferring the second photolithography mask to the photoresist layer, using an on-axis illumination system in order to transfer the second semiconductor patterns to the photoresist layer.

27. The method according to claim 1, further comprising forming line patterns and a planarized insulating interlayer covering the patterns between the semiconductor substrate and the photoresist layer.

28. The method according to claim 19, wherein holes in the first mask partially overlap holes in the second mask.

* * * * *